US009357323B2

(12) United States Patent
Ramabadran

(10) Patent No.: US 9,357,323 B2
(45) Date of Patent: May 31, 2016

(54) METHOD AND APPARATUS FOR AUDIO MATRIX DECODING

(75) Inventor: Tenkasi V. Ramabadran, Naperville, IL (US)

(73) Assignee: GOOGLE TECHNOLOGY HOLDINGS LLC, Mountain View, CA (US)

( * ) Notice: Subject to any disclaimer, the term of this patent is extended or adjusted under 35 U.S.C. 154(b) by 968 days.

(21) Appl. No.: 13/468,053

(22) Filed: May 10, 2012

(65) Prior Publication Data

US 2013/0301836 A1 Nov. 14, 2013

(51) Int. Cl.

*H04R 5/00* (2006.01)
*H03G 3/00* (2006.01)
*H04S 3/02* (2006.01)

(52) U.S. Cl.

CPC ........................................ *H04S 3/02* (2013.01)

(58) Field of Classification Search

CPC ....... H04S 3/02; H04S 3/008; H04S 2420/01; H04S 2420/03; G10L 19/008; H04H 20/89
USPC ........... 381/20–23, 17–19, 98–104, 107, 108, 381/61, 307
See application file for complete search history.

(56) References Cited

U.S. PATENT DOCUMENTS 4,799,260 A 1/1989 Mandell et al.
6,920,223 B1 7/2005 Fosgate

OTHER PUBLICATIONS

Dressler, Roger: "Pro Logic Surround Decoder Principles of Operation", Dolby Laboratories, Inc.,c. 1998, Dolby Laboratories Information S93/8624/9827, all pages.

(Continued)

*Primary Examiner* — Davetta W Goins
*Assistant Examiner* — Daniel Sellers
(74) *Attorney, Agent, or Firm* — Morris & Kamlay LLP

(57) ABSTRACT

An audio matrix decoder is provided for decoding input signals $L_t$ and $R_t$ into output signals $L_{out}$, $C_{out}$, $S_{out}$, and $R_{out}$. The decoder circuit includes a main signal path having a passive matrix decoder and a cross talk canceller configured to apply variable gain values to intermediate signals and to compute the output signals $L_{out}$, $C_{out}$, $S_{out}$, and $R_{out}$. The decoder also includes a control signal path having a passive matrix decoder and a linear equation solver. The linear equation solver is configured to compute the variable gain values based on the intermediate signals and the necessary condition that re-encoded values of the output signals $L_{out}$, $C_{out}$, $S_{out}$, and $R_{out}$ are equal to the input signals $L_t$ and $R_t$. The linear equation solver is also configured to feed the variable gain values to the cross talk canceller for use in computing the output signals.

9 Claims, 17 Drawing Sheets

(56) References Cited

OTHER PUBLICATIONS

Gundry, Kenneth: "A New Active Matrix Decoder for Surround Sound", 19th International Conference: Surround Sound—Techniques, Technology, and Perception, Jun. 2001, paper No. 1905, all pages.
Scheiber, Peter: "Analyzing Phase-Amplitude Matrices", presented Oct. 7, 1971, at the 41st Convention of the Audio Engineering Society, New York, Nov. 1971, vol. 19, No. 10, pp. 835-839.
Dressler, Roger: "Dolby Surround Pro Logic II Decoder Principles of Operation", © 2000 Dolby Laboratories, Inc. S00/13238, all pages.

METHOD AND APPARATUS FOR AUDIO MATRIX DECODING

TECHNICAL FIELD

The present disclosure relates, generally, to audio signal processing techniques and, in particular, to audio matrix decoding schemes in which two or more audio signal streams (or "channels"), each associated with a direction or spatial orientation, are decoded (i.e., extracted) from a pair of audio input signal streams.

BACKGROUND

Audio matrix encoding and decoding schemes are generally well known. Early "surround sound" technologies employed a 4:2:4 process in which four discrete audio channels are encoded (or downmixed) into two channels, passed through a two channel medium (e.g. an LP record), and subsequently decoded (or upmixed) back to four channels before being presented to four speakers. The 4:2:4 process often entails information loss, i.e., the four channels reproduced at the final stage are not necessarily identical to the four initially encoded channels. When a matrix decoder is not available, the two encoded audio channels can be played using a standard two channel stereo player.

Examples of surround sound systems employing the 4:2:4 process include the SQ (Stereo Quadraphonic) system introduced by CBS in 1971 and the QS (Quadraphonic Stereo) system by Sansui also introduced in 1971. Both the SQ and QS systems use speakers in a square configuration: left front; right front; left back; and right back. Another example of a system employing the 4:2:4 process is the Dolby Surround system introduced in 1982. This system uses speakers in a diamond configuration: left front; center; right front; and one or more rear speakers referred to as "surround" speakers.

The Dolby Surround system uses an encoding matrix known as the Dolby MP (Motion Picture) Matrix which encodes four channels of audio into a standard two channel format suitable for recording and stereo transmission. The Dolby Surround decoder recovers the four audio channels from the two encoded channels using a (4×2) decoding matrix. Since the coefficients of the decoding matrix are constants, the Dolby Surround decoder is generically referred to as a "passive" decoder. Such a decoder may provide in the range of a 3 dB separation between adjacent channels, e.g., between left and surround channels.

Passive decoders are limited in their ability to spatially orient sounds with precision for various listening positions. Active decoders, on the other hand, adapt the decoding matrix coefficients to enhance the directionality of sounds. These decoders reduce the crosstalk between channels and increase channel separation. An example of active decoders is the Dolby Pro Logic decoder introduced in 1987.

The Dolby Pro Logic II matrix decoding technology was introduced in 2000. This decoder extracts five channels of audio from a stereo (i.e. two-channel) signal: left front; center; right front; right back; and left back. The Dolby Pro Logic II decoder is suitable for use with current 5.1 surround systems, where the "0.1" refers to the reduced bandwidth low frequency effects (LFE) channel. The Dolby Pro Logic II encoder downmixes five channels of audio (or six with LFE) into two channels which can be played over a standard stereo player if no decoder is available.

Presently known active matrix decoders employ "ad hoc" schemes for computing their associated gain values, rendering them unnecessarily complex and inaccurate.

BRIEF DESCRIPTION OF THE DRAWINGS

The present disclosure will hereinafter be described in conjunction with the following drawing figures, wherein like numerals denote like elements, and wherein.

DETAILED DESCRIPTION

Figure 1:
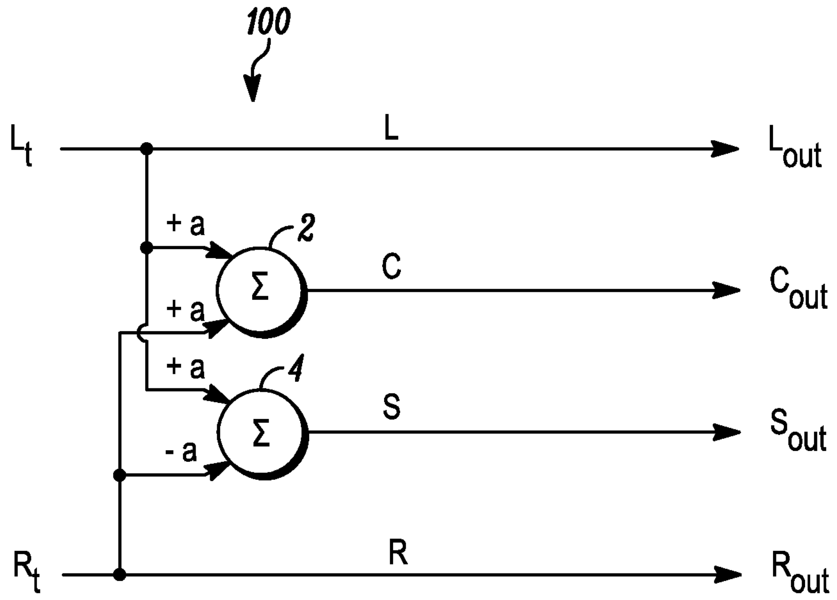
PRIOR ART FIG. 1
FIG. 1 is a functional and schematic diagram of a prior art passive matrix decoder with four outputs useful in understanding the present disclosure.

The following detailed description is merely exemplary in nature and is not intended to limit the application and uses of the audio matrix decoder described herein. Furthermore, there is no intention to be bound by any theory presented in the preceding background or the following detailed description.

Broadly, one or more example embodiments provide one or more methods and apparatuses, which recognize and exploit various relationships among certain intermediate signals within the audio matrix decoder. These relationships are derived essentially by re-encoding the decoded signals and requiring them to match the input encoded signals. The resulting decoder that employs these additional relationships is simpler, and more accurate than prior art decoders.

In an embodiment, a decoder and method of programming a decoder are provided for decoding, over a panning angle α, input signals $L_t$ and $R_t$ into a left output signal $L_{out}$, a center output signal $C_{out}$, at least one surround output signal $S_{out}$, and a right output signal $R_{out}$. The decoder circuit includes a main signal path having: i) a passive matrix decoder configured to decode said input signals $L_t$ and $R_t$ into a left intermediate signal L, a center intermediate signal C, at least one surround intermediate signal S, and a right intermediate signal R; and ii) a cross talk canceller configured to apply respective variable gain values $g_l$, $g_c$, $g_s$, and $g_r$ to the intermediate signals L, C, S, and R, respectively, and to compute the output signals $L_{out}$, $C_{out}$, $S_{out}$, and $R_{out}$.

The decoder also includes a control signal path having: i) a passive matrix decoder configured to output intermediate signals $L_f$, $C_f$, $S_f$, and $R_f$ based on the input signals $L_t$ and $R_t$; and ii) a linear equation solver. The linear equation solver is configured to compute the variable gain values $g_l$, $g_c$, $g_s$, and $g_r$ based on the intermediate signals $L_f$, $C_f$, $S_f$, and $R_f$, and the necessary condition that re-encoded values of output signals $L_{out}$, $C_{out}$, $S_{out}$, and $R_{out}$ are equal to input signals $L_t$ and $R_t$. The linear equation solver is also configured to feed the variable gain values to the cross talk canceller for use in computing the output signals $L_{out}$, $C_{out}$, $S_{out}$, and $R_{out}$.

In another embodiment, an audio matrix decoder is provided for decoding respective input signals $L_t$ and $R_t$ into respective output signals $L_{out}$, $C_{out}$, $S_{out}$, and $R_{out}$ for a panning angle α. The decoder includes a passive matrix decoder module having first and second summers, each having a scaling coefficient a. The passive matrix decoder module is further configured to decode input signals $L_t$ and $R_t$ into intermediate signals L, C, S, and R. The decoder also includes a cross talk canceller module having a first gain element configured to apply a variable gain $g_l$ to intermediate signal L, a second gain element configured to apply a variable gain $g_c$ to intermediate signal C, a third gain element configured to apply a variable gain $g_s$ to intermediate signal S, a fourth gain element configured to apply a variable gain $g_r$ to intermediate signal R, a third summer having a scaling coefficient p, a fourth summer having a scaling coefficient a, a fifth summer having a scaling coefficient a, and a sixth summer having a scaling coefficient p, where p=1/(2a), and $$g_l = \frac{|C|}{a\cdot|L|},\ g_c = 0,\ g_s = \frac{|R|}{p\cdot|S|},\ \text{and } g_r = 0 \text{ for } 0 \le \alpha < 90;$$

$$g_l = \frac{|S|}{a\cdot|L|},\ g_c = \frac{|R|}{p\cdot|C|},\ g_s = 0,\ \text{and } g_r = 0 \text{ for } 90 \le \alpha < 180;$$

$$g_l = 0,\ g_c = \frac{|L|}{p\cdot|C|},\ g_s = 0,\ \text{and } g_r = \frac{|S|}{a\cdot|R|} \text{ for } 180 \le \alpha < 270;$$

and $$g_l = 0,\ g_c = 0,\ g_s = \frac{|L|}{p\cdot|S|},\ \text{and } g_r = \frac{|C|}{a\cdot|R|} \text{ for } 270 \le \alpha < 360.$$

In a further embodiment, an audio matrix decoder is provided for decoding respective input signals $L_t$ and $R_t$ into respective output signals $L_{out}$, $C_{out}$, $LB_{out}$, $RB_{out}$, and $R_{out}$ for a panning angle α. The audio matrix decoder includes a passive matrix decoder module having a first summer with scaling coefficient a, a second summer with scaling coefficients b and d, and a third summer with scaling coefficients b and d. The passive matrix decoder module is configured to decode the input signals $L_t$ and $R_t$ into intermediate signals L, C, LB, RB, and R.

The decoder also includes a cross talk canceller module having a first gain element configured to apply a variable gain $g_l$ to intermediate signal L, a second gain element configured to apply a variable gain $g_c$ to intermediate signal C, a third gain element configured to apply a variable gain $g_{lb}$ to intermediate signal LB, a fourth gain element configured to apply a variable gain $g_{rb}$ to said intermediate signal RB, a fifth gain element configured to apply a variable gain $g_r$ to intermediate signal R, a fourth summer having scaling coefficients q, p, and t, a fifth summer having scaling coefficients a and u, a sixth summer having scaling coefficients b, d, v, and w, a seventh summer having scaling coefficients d, b, v, and w, and an eighth summer having scaling coefficients q, p, and t, wherein $$q = \frac{b}{b^2 + d^2};$$

$$t = \frac{d}{b^2 + d^2};$$

$$u = \frac{a\cdot(b-d)}{b^2 + d^2};$$

$$v = \frac{(b-d)}{2\cdot a};\ \text{and}$$

$$w = \frac{2\cdot b\cdot d}{b^2 + d^2}.$$

In various embodiments, the gain values may be computed such that $$g_l = 0,\ g_c = 0,\ g_{lb} = \frac{q\cdot|RB|\cdot|L| - t\cdot|RB|\cdot|R|}{(q^2 - t^2)\cdot|LB|\cdot|RB|},$$

$$g_{rb} = \frac{q\cdot|LB|\cdot|R| - t\cdot|LB|\cdot|L|}{(q^2 - t^2)\cdot|LB|\cdot|RB|},$$

and $$g_r = 0 \text{ for } (328.67 \le \alpha < 360) \text{ and } (0 \le \alpha < 31.33);$$

-continued $$g_l = \frac{t\cdot|C| - u\cdot|R|}{t\cdot a\cdot|L|},\ g_c = 0,\ g_{lb} = \frac{|R|}{t\cdot|LB|},\ g_{rb} = 0, \text{ and}$$

$$g_r = 0 \text{ for } 31.33 \le \alpha < 90;$$

$$g_l = \frac{p\cdot|LB| - v\cdot|R|}{p\cdot b\cdot|L|},\ g_c = \frac{|R|}{p\cdot|C|},\ g_{lb} = 0,\ g_{rb} = 0, \text{ and}$$

$$g_r = 0 \text{ for } 90 \le \alpha < 180;$$

$$g_l = 0,\ g_c = \frac{|L|}{p\cdot|C|},\ g_{lb} = 0,\ g_{rb} = 0, \text{ and } g_r = \frac{p\cdot|RB| - v\cdot|L|}{p\cdot b\cdot|R|}$$

for $180 \le \alpha < 270$; and $$g_l = 0,\ g_c = 0,\ g_{lb} = 0,\ g_{rb} = \frac{|L|}{t\cdot|RB|}, \text{ and } g_r = \frac{t\cdot|C| - u\cdot|L|}{t\cdot a\cdot|R|}$$

for $270 \le \alpha < 328.67$.

A.) Four Output Matrix Decoders

FIG. 1 shows a prior art passive matrix decoder 100 having a first summer 2 and a second summer 4. The inputs to the decoder are the signals $L_t$ ("left total") and $R_t$ ("right total"). The input signals are linearly combined to form the intermediate signals L ("left"), C ("center"), S ("surround"), and R ("right") as follows. The signals $L_t$ and $R_t$ directly serve as the signals L and R respectively. The signals $L_t$ and $R_t$ are both scaled by a coefficient "a" and summed in summer 2 to form the signal C. The signal $L_t$ is scaled by coefficient a and the signal $R_t$ is scaled by −a and the two scaled signals are summed in summer 4 to form the signal S. The relationship between the inputs and the intermediate signals can be expressed by the following equations:

$$L = L_t \quad (1)$$

$$C = a\cdot(L_t + R_t) \quad (2)$$

$$S = a\cdot(L_t - R_t) \quad (3)$$

and $$R = R_t \quad (4)$$

where a>0 is a scaling coefficient. The scaling coefficient a is typically chosen such that the maximum power in the signals C and S is the same as in the input signals $L_t$ and $R_t$, that is, $a=\sqrt{1/2}=0.707$. The intermediate signals L, C, S, and R directly serve as the output signals $L_{out}$, $C_{out}$, $S_{out}$, and $R_{out}$. The relationship between the intermediate signals and the outputs can be expressed by the following equations:

$$L_{out} = L \quad (5)$$

$$C_{out} = C \quad (6)$$

$$S_{out} = S \quad (7)$$

and $$R_{out} = R \quad (8)$$

Equations (1) through (4) can also be expressed using vector notation as $$y = F\cdot x \quad (9)$$

where $$x = \begin{bmatrix} L_t \\ R_t \end{bmatrix}, \quad (10)$$

-continued $$y = \begin{bmatrix} L \\ C \\ S \\ R \end{bmatrix}, \text{ and} \quad (11)$$

$$F = \begin{bmatrix} 1 & 0 \\ +a & +a \\ +a & -a \\ 0 & 1 \end{bmatrix}. \quad (12)$$

Similarly, equations (5) through (8) can be expressed using vector notation as $$z = I\cdot y \quad (13)$$

where $$z = \begin{bmatrix} L_{out} \\ C_{out} \\ S_{out} \\ R_{out} \end{bmatrix}, \quad (14)$$

and I is the (4×4) identity matrix.

Combining equations (13) and (9) yields $$z = I\cdot y = I\cdot F\cdot x = F\cdot x \quad (15)$$

Since the output vector z is obtained by pre-multiplying the input vector x by a (4×2) matrix F with constant coefficients, such a decoder is referred to as a "passive" matrix decoder.

Figure 3:
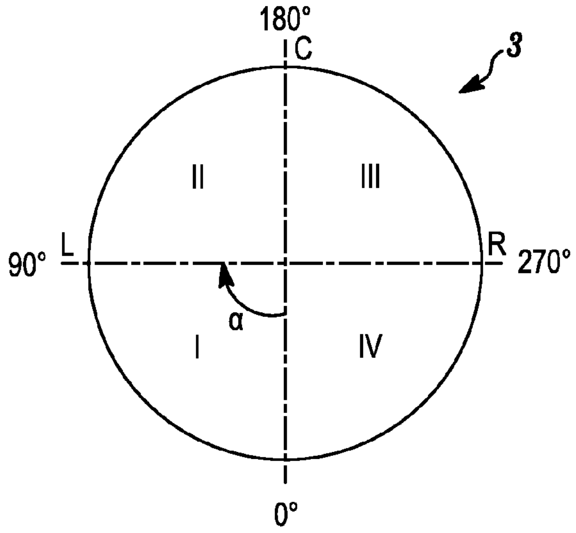
FIG. 3 is a schematic diagram showing the angular positions corresponding to the four outputs of the decoders in FIG. 1 and FIG. 2.

Referring now to FIG. 3, the symbols L, C, S, and R associated with the intermediate signals in equations (1) through (4), as well as the decoder outputs in equations (5) through (8), are indicative of the directions or angular positions of the signals. More particularly, assuming that a listener is located at the center of a circle 3 in FIG. 3, the "surround" signal S is positioned behind the listener corresponding to a panning angle α=0°. The "left" signal L is positioned at α=90°, the "center" signal C is positioned at α=180°, and the "right" signal R is positioned at α=270°.

With continued reference to FIG. 3, the angular segment between 0° and 90° is denoted as segment I (0≤α<90), the angular segment between 90° and 180° is denoted as segment II (90≤α<180), the angular segment between 180° and 270° is denoted as segment III (180≤α<270), and the angular segment between 270° and 360° is denoted as segment IV (270≤α<360). Although these angular positions correspond to the respective source signals while encoding them to form the encoded signals $L_t$ and $R_t$, the situation during reproduction, i.e., when the decoded signals are played to a listener using multiple speakers, may be quite different. For example, while playing "surround sound" audio via a Pro Logic decoder, the "left" and "right" speakers are typically positioned so that they are 30° or 40° on either side of the "center" speaker directly in front of the listener. Also, the decoded "surround" signal may be played through more than one speaker placed behind and/or to one or both sides of the listener.

Figure 4A:
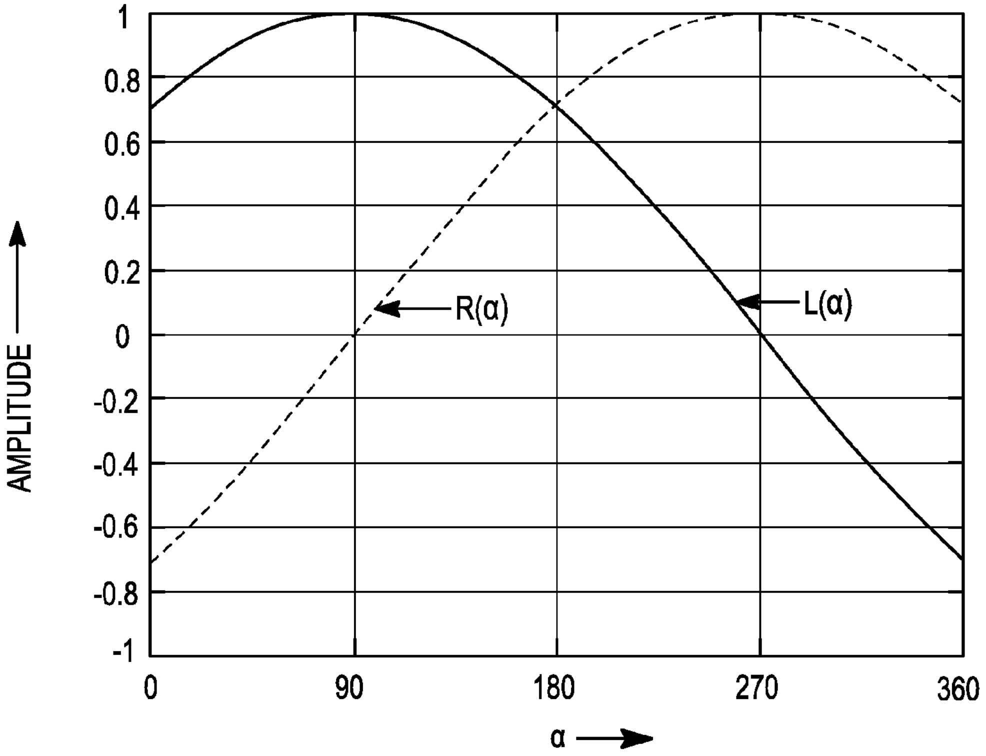
FIG. 4A is a graph showing the relative magnitudes and polarities of the encoded input signals $L_t$ and $R_t$ (or equivalently the intermediate signals L and R) as a function of the panning angle $\alpha$ (in degrees)

In a "surround sound" system, multiple source signals (e.g. four) are downmixed into the two encoded signals $L_t$ and $R_t$. The signals $L_t$ and $R_t$ carry information about the underlying "audio" as well as the direction of the source signals. This disclosure primarily relates to the directional information carried by the signals $L_t$ and $R_t$, and how to decode that information. The encoding of the direction of a source signal into $L_t$ and $R_t$ (or, equivalently, the intermediate signals L and R) is depicted in FIG. 4A.

From the graphs which show the proportion of the source signal assigned to $L_t$ and $R_t$ as α ranges from 0 to 360 degrees, it may be seen that the angular information α is essentially encoded in the amplitude (i.e. both magnitude and polarity) of the signals $L_t$ and $R_t$. For example, when α=90° ("left"), $L_t$=1 and $R_t$=0; when α=180° ("center"), $L_t=\sqrt{1/2}$ and $R_t=\sqrt{1/2}$; when α=0° ("surround"), $L_t=\sqrt{1/2}$ and $R_t=-\sqrt{1/2}$; and when α=270° ("right"), $L_t$=0 and $R_t$=1. For α in the range between 90° and 270° i.e. for the front half of the circle, $L_t$ and $R_t$ have the same polarity. Outside of this range, i.e. for the rear half of the circle, they have the opposite polarity. Notice that there is a discontinuity in the graphs at α=0° (or α=360°). Moreover, the total power contribution made by a source signal equals unity, i.e., $L_t^2(\alpha)+R_t^2(\alpha)=1$; that is, the amplitudes of the input signals $L_t$ and $R_t$ are not independent. The graphs shown in FIG. 4A can be expressed by the following equations:

$$L_t(\alpha) = \cos\left(\frac{\alpha - 90}{2}\right) \quad (16)$$

$0 \le \alpha < 360$, and $$R_t(\alpha) = \sin\left(\frac{\alpha - 90}{2}\right) \quad (17)$$

$0 \le \alpha < 360$.

Figure 4B:
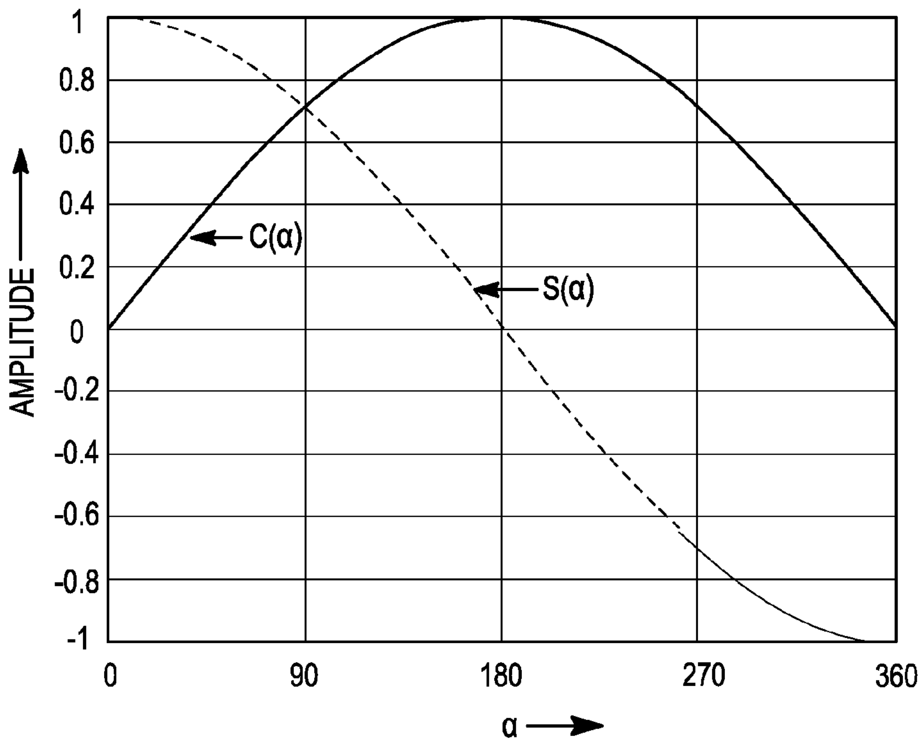
FIG. 4B is a graph showing the relative magnitudes and polarities of the normalized sum and difference of the encoded input signals $L_t$ and $R_t$ (or equivalently the intermediate signals C and S) as a function of the panning angle $\alpha$ (in degrees)

FIG. 4B illustrates the "sum" and "difference" of the encoded signals $L_t$ and $R_t$ (normalized such that the maximum amplitude is unity) as a function of the panning angle α. These are identical to the signals C and S in equations (2) and (3), respectively, with the scaling coefficient "a" selected to be $\sqrt{1/2}$=0.707. Notice that the amplitude (magnitude and polarity) of these signals changes with the panning angle α similar to the encoded signals $L_t$ and $R_t$. For example, when α=0° ("surround"), C=0 and S=1; when α=90° ("left"), C=$\sqrt{1/2}$ and S=$\sqrt{1/2}$; when α=180° ("center"), C=1 and S=0; and when α=270° ("right"), C=$\sqrt{1/2}$ and S=$-\sqrt{1/2}$. For α in the range between 0° and 180°, i.e., for the left half of circle 3 in FIG. 3, C and S have the same polarity. For α in the range between 180° and 360° (the right half of circle 3), C and S have the opposite polarity. Moreover, the total power in these signals sums to unity i.e. $C^2(\alpha)+S^2(\alpha)=1$. The graphs shown in FIG. 4B can be expressed by the following equations:

$$C(\alpha) = 0.707 \cdot (L_t(\alpha) + R_t(\alpha)) = \sin\left(\frac{\alpha}{2}\right) \quad (18)$$

$0 \le \alpha < 360$, and $$S(\alpha) = 0.707 \cdot (L_t(\alpha) - R_t(\alpha)) = \cos\left(\frac{\alpha}{2}\right) \quad (19)$$

$0 \le \alpha < 360$.

From equations (1) through (8) or, equivalently, from equations (10), (12), (14), and (15), the outputs of passive matrix decoder 1 in FIG. 1 (for a=0.707) can be written as: $L_{out}=L_t$; $C_{out}=0.707\cdot(L_t+R_t)$; $S_{out}=0.707\cdot(L_t-R_t)$; and $R_{out}=R_t$. From the graphs shown in FIG. 4A and FIG. 4B, it is seen that $L_{out}$ attains a maximum value of unity at α=90° ("left"), $C_{out}$ attains a maximum value of unity at α=180° ("center"), $S_{out}$ attains a maximum value of unity at α=0° ("surround"), and $R_{out}$ attains a maximum value of unity at α=270° ("right"). The directions or angles at which the outputs of a decoder rise to a maximum are referred to as the "principal" or "cardinal" directions. For the 4-output decoder shown in FIG. 1, the principal directions are 0°, 90°, 180°, and 270° or "surround", "left", "center", and "right", respectively.

Also, from the graphs in FIG. 4A, it is seen that when $L_{out}$ reaches a maximum of 1, $R_{out}$=0 and vice versa. Thus, there is an infinite "separation" (in terms of the ratio between the two values) between the "left" and "right" directions. Similarly, from the graphs in FIG. 4B, it is seen that when $C_{out}$ reaches a maximum of 1, $S_{out}$=0 and vice versa. Thus, there is also an infinite separation between the "center" and "surround" directions. In this way, the 4-output passive matrix decoder 1 of FIG. 1 provides an infinite separation between opposite principal directions. However, the separation is only 3 dB between adjacent directions, e.g., between "left" and "center" or between "right" and "surround". This is due to the presence of "cross-talk" between the channels such as, for example, when $L_{out}$=1 for α=90°, $C_{out}=S_{out}$=0.707 instead of the ideal value of 0. Active matrix decoders are designed to reduce such "cross-talk", and thereby enhance the directionality of the decoded signals, by adapting the matrix coefficients.

Figure 2:
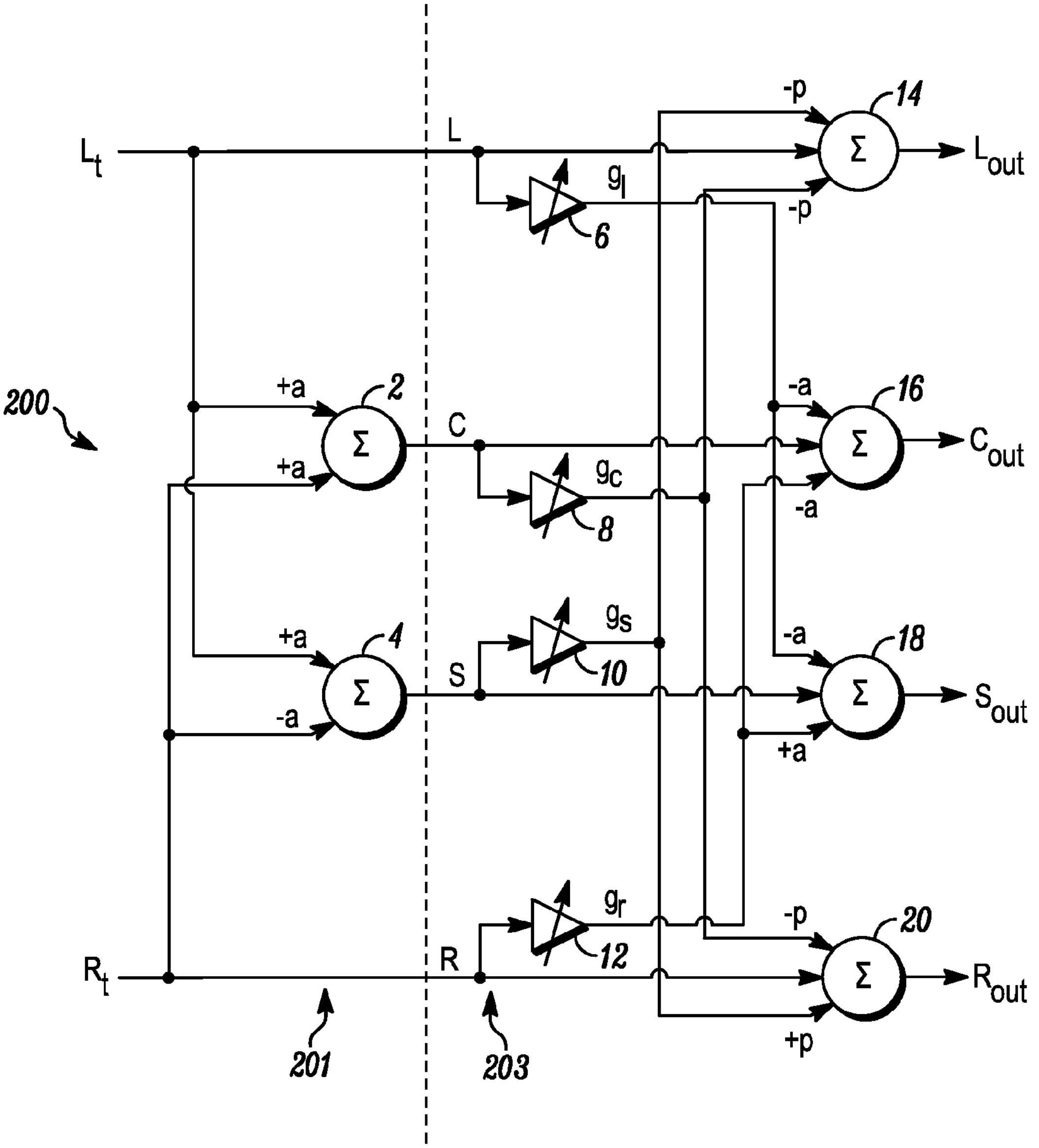
FIG. 2 is a functional and schematic diagram of an active matrix decoder with four outputs useful in understanding the present disclosure.

FIG. 2 shows an active matrix decoder 200 including a passive matrix decoder 201 and a cross talk canceller 203. The inputs to the decoder are the signals $L_t$ and $R_t$. From the inputs, the intermediate signals L, C, S, and R are formed in the same manner as in FIG. 1, using summers 2 and 4 and the scaling coefficient a. The relationship between the inputs and the intermediate signals are expressed by equations (1) through (4) (or equivalently by equations (9) through (12)).

From the intermediate signals L, C, S, and R, the decoder outputs are formed using respective variable gain elements 6, 8, 10, and 12; respective summers 14, 16, 18, and 20; and scaling coefficients a and p. The variable gain values (gains) associated with the intermediate signals L, C, S, and R are denoted, respectively, by $g_l$, $g_c$, $g_s$, and $g_r$. To form the output signal $L_{out}$, for example, the intermediate signal L, the intermediate signal C multiplied by the variable gain $g_c$ (element 8) and the scaling coefficient −p, and the intermediate signal S multiplied by the variable gain $g_s$ (element 10) and the scaling coefficient (−p) are added together in the summer 14. The remaining outputs $C_{out}$, $S_{out}$, and $R_{out}$ are formed in a similar manner, as shown in FIG. 2. The relationship between the intermediate signals and the decoder outputs can be expressed by the following equations:

$$L_{out}=L-p\cdot g_c\cdot C-p\cdot g_s\cdot S \quad (20)$$

$$C_{out}=C-a\cdot g_l\cdot L-a\cdot g_r\cdot R \quad (21)$$

$$S_{out}=S-a\cdot g_l\cdot L+a\cdot g_r\cdot R \quad (22)$$

and $$R_{out}=R-p\cdot g_c\cdot C+p\cdot g_s\cdot S \quad (23)$$

where the scaling coefficient p>0 is given by $$p = \frac{1}{2\cdot a}, \quad (24)$$

The choice of the scaling coefficients for the signals summed by the summers 14, 16, 18, and 20 is done in such a way that the gains $g_l$, $g_c$, $g_s$, and $g_r$ have a maximum value of unity. The choice of a=$\sqrt{1/2}$=0.707 results in p=a.

Equations (20) through (23) can also be expressed using vector notation as $$z = G \cdot y \tag{25}$$

and $$G = \begin{bmatrix} 1 & -p \cdot g_c & -p \cdot g_s & 0 \\ -a \cdot g_l & 1 & 0 & -a \cdot g_r \\ -a \cdot g_l & 0 & 1 & +a \cdot g_r \\ 0 & -p \cdot g_c & +p \cdot g_s & 1 \end{bmatrix}. \tag{26}$$

Combining equations (9) and (25), we have $$z = G \cdot y = G \cdot F \cdot x = H \cdot x \tag{27}$$

where $$H = \begin{bmatrix} h_{l,l} & h_{l,r} \\ h_{c,l} & h_{c,r} \\ h_{s,l} & h_{s,r} \\ h_{r,l} & h_{r,r} \end{bmatrix} = \begin{bmatrix} 1 - 0.5g_c - 0.5g_s & -0.5g_c + 0.5g_s \\ +a \cdot (1 - g_l) & +a \cdot (1 - g_r) \\ +a \cdot (1 - g_l) & -a \cdot (1 - g_r) \\ -0.5g_c + 0.5g_s & 1 - 0.5g_c - 0.5g_s \end{bmatrix}. \tag{28}$$

In deriving the elements of the matrix H, equation (24) has been used to replace the product term "p·a" by 0.5. Because the elements of H are made up of variable terms, it is referred to as an "active" or "adaptive" matrix. Note that the active matrix H is composed of the passive matrix F and the matrix G. Equivalently, FIG. 2 illustrates a passive stage (passive matrix decoder 201) including summers 2, 4, and the scaling coefficient a, followed by an active stage (cross talk canceller 203) including the variable gain elements 6, 8, 10, and 12, summers 14, 16, 18, and 20, and the scaling coefficients a and p. Thus, an active matrix decoder may be obtained by combining a passive matrix decoder with a cross-talk canceller.

With reference to FIG. 2, cross talk canceller 203 takes the intermediate signals L, C, S, and R as inputs and forms the outputs $L_{out}$, $C_{out}$, $S_{out}$, and $R_{out}$. The matrix G (see equation (26)) corresponds to the cross-talk canceller. If the gains $g_l$, $g_c$, $g_s$, and $g_r$ are all selected to be zero, the matrix G becomes an identity matrix and the active matrix H degenerates into the passive matrix F.

To illustrate the operation of cross-talk canceller 203, consider a single source at α=90°, i.e., corresponding to the "left" cardinal direction. In this case, $L_t$=1 and $R_t$=0. Suppose we choose $g_l$=1, and $g_c$=$g_s$=$g_r$=0, and substitute these values into the matrix H. From equations (10), (14), (27), and (28), $$\begin{bmatrix} L_{out} \\ C_{out} \\ S_{out} \\ R_{out} \end{bmatrix} = \begin{bmatrix} 1 & 0 \\ 0 & +a \\ 0 & -a \\ 0 & 1 \end{bmatrix} \cdot \begin{bmatrix} 1 \\ 0 \end{bmatrix} = \begin{bmatrix} 1 \\ 0 \\ 0 \\ 0 \end{bmatrix}.$$

In this case, $L_{out}$=1 and $C_{out}$=$S_{out}$=$R_{out}$=0, providing perfect directionality, or complete cross-talk cancellation. It can be verified that for each of the four principal directions, choosing the gain associated with that particular direction to be unity and choosing the remaining gains to be zero results in perfect cross-talk cancellation. However, for a source that does not correspond to one of the four principal directions, selecting gains $g_l$, $g_c$, $g_s$, and $g_r$ to provide optimal (or at least enhanced) directionality is more difficult.

U.S. Pat. No. 6,920,223, states that if the magnitudes of $L\cdot(1-g_l)$ and $R\cdot(1-g_r)$ (and, similarly, the magnitudes of $C\cdot(1-g_c)$ and $S\cdot(1-g_s)$) are kept equal, that is, if $L\cdot(1-g_l)=R\cdot(1-g_r)$ and $C\cdot(1-g_c)=S\cdot(1-g_s)$, then the resulting gains would yield complete cross talk cancellation (perfect directionality) for any source angle α. However, this approach to defining gain values is unnecessarily complex. For example, in order to keep the ripple small in the signal envelopes, smoothing time constants of the order of one second have to be used. Also, the approach does not directly translate into decoders having five or more outputs and, thus, ad hoc techniques are required to generate the control signals (i.e., the variable gain signals). Accordingly, the present disclosure provides the following simple and direct approach to computing variable gain values for use in cancelling cross talk in an active matrix decoder.

Figure 5:
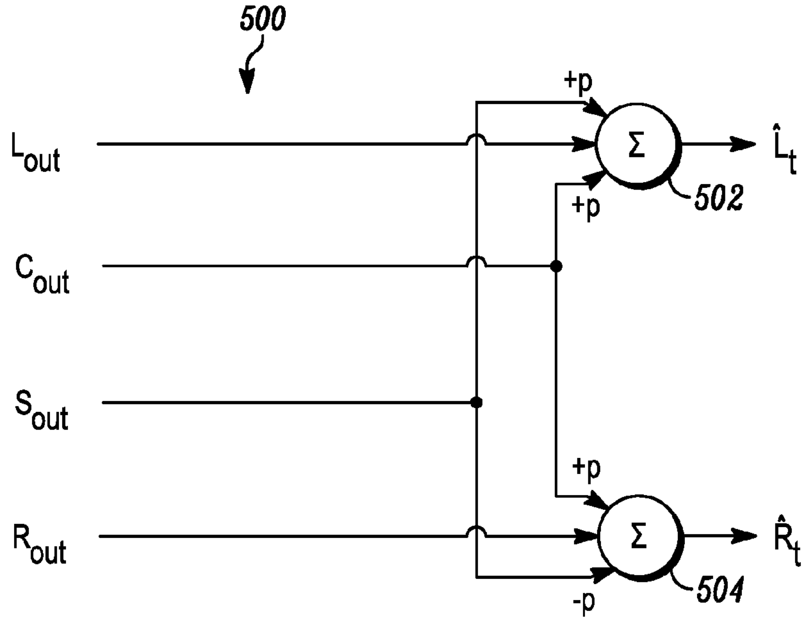
FIG. 5 is a functional and schematic diagram of a (4×2) matrix encoder useful in deriving some additional relationships between certain intermediate signals within the active matrix decoder of FIG. 2.

FIG. 5 shows an encoder 500 having respective summers 502 and 504 which take, as inputs, the outputs of decoder 200 (FIG. 2), namely, $L_{out}$, $C_{out}$, $S_{out}$, and $R_{out}$. Encoder 500 re-encodes signals $L_{out}$, $C_{out}$, $S_{out}$, and $R_{out}$, into outputs $\hat{L}_t$, and $\hat{R}_t$. If the original decoding (FIG. 2) is done correctly, it follows that re-encoding the outputs of decoder 200 (via re-encoder 500) should reproduce the inputs to decoder 200. Significantly, the resultant re-encoding equations can then be used as necessary conditions for decoding. The relationship between the inputs and outputs of encoder 500 may be expressed by the following equations:

$$\hat{L}_t = L_{out} + p \cdot C_{out} + p \cdot S_{out} \tag{29}$$

and $$\hat{R}_t = R_{out} + p \cdot C_{out} - p \cdot S_{out} \tag{30}$$

The scaling coefficients for the signals summed by the summers 502 and 504 in FIG. 5 are selected in such a way that the encoded signals will have the same power as the input signals to decoder 200. Equations (29) and (30) may also be expressed using vector notation as $$\hat{x} = E \cdot z \tag{31}$$

where $$E = \begin{bmatrix} 1 & +p & +p & 0 \\ 0 & +p & -p & 1 \end{bmatrix} \tag{32}$$

is the encoding (or "re-encoding") matrix.

Substituting equations (20) through (23) in (29) and (30), and using equations (1) through (4) and (24) to simplify, we obtain $$\hat{L}_t = L_t + (1-g_l) \cdot L - p \cdot g_c \cdot C - p \cdot g_s \cdot S \tag{33}$$

$$\hat{R}_t = R_t + (1-g_r) \cdot R - p \cdot g_c \cdot C + p \cdot g_s \cdot S \tag{34}$$

In equations (33) and (34), $L_t$ and L (and similarly $R_t$ and R) may be used interchangeably as provided by equations (1) and (4). Requiring that $\hat{L}_t$=$L_t$ in equation (33) and $\hat{R}_t$=$R_t$ in equation (34) yields the following conditions:

$$(1-g_l) \cdot L - p \cdot g_c \cdot C - p \cdot g_s \cdot S = 0 \tag{35}$$

$$(1-g_r) \cdot R - p \cdot g_c \cdot C + p \cdot g_s \cdot S = 0 \tag{36}$$

Summing equation (36) to (35), multiplying by a, and simplifying the result using equations (1) through (4) and (24) yields $$(1-g_c) \cdot C - a \cdot g_l \cdot L - a \cdot g_r \cdot R = 0 \tag{37}$$

Similarly, subtracting equation (36) from (35), multiplying by a, and simplifying the result using equations (1) through (4) and (24) yields $$(1-g_s) \cdot S - a \cdot g_l \cdot L - a \cdot g_r \cdot R = 0 \tag{38}$$

Equations (35) through (38) thus represent the necessary conditions for correct decoding. Note that only two of the four equations (35) through (38) are linearly independent.

Equations (20) through (23) specify the decoder outputs in terms of the intermediate signals L, C, S, and R, the variable gains $g_l$, $g_c$, $g_s$, and $g_r$, and the scaling coefficients a and p. When a source is positioned along one of the four principal directions, e.g., "left", the corresponding output, namely, $L_{out}$, is expected to be non-zero and the remaining three outputs $C_{out}$, $S_{out}$, and $R_{out}$ are expected to be zero.

If, on the other hand, a source is positioned between two principal directions, e.g., between "surround" and "left" in segment I, we would expect the adjacent outputs $S_{out}$ and $L_{out}$ to be non-zero, and the remote (i.e., non-adjacent) outputs $C_{out}$, and $R_{out}$ to be zero. This idea is referred to as 'pair-wise pan-potting', and suggests that a single source in any arbitrary direction may be reproduced by the two speakers closest to the source, with the other two outputs (in a four output system) being zero. More generally, equations (20) through (23) may be written with the outputs set to zero as shown below:

$$L-p\cdot g_c\cdot C-p\cdot g_s\cdot S=0 \tag{39}$$

$$C-a\cdot g_l\cdot L-a\cdot g_r\cdot R=0 \tag{40}$$

$$S-a\cdot g_l\cdot L+a\cdot g_r\cdot R=0 \tag{41}$$

and $$R-p\cdot g_c\cdot C+p\cdot g_s\cdot S=0 \tag{42}$$

For a source positioned at any given panning angle α, only two of the four equations (39) through (42) are valid (corresponding to the two cardinal directions away from the source). Accordingly, two equations from (35) through (38) and the two valid equations from (39) through (42) can be combined to form a system of four simultaneous linear equations. This system of equations can then be solved to compute the gains $g_l$, $g_c$, $g_s$, and $g_r$ using standard, well known methods from linear algebra. However, a simpler solution is possible as illustrated below.

Consider the situation where the source is positioned in segment I, i.e., 0≤α<90. In this case, from the graphs in FIG. 4A and FIG. 4B, we have L>0, C≥0, S>0, and R<0. Also, $C_{out}=R_{out}=0$ as per equations (40) and (42). From equations (36) and (42), $g_r=0$; and from equations (37) and (40), $g_c=0$. Substituting $g_r=0$ in equation (40) and noting that L>0 (hence, |L|=L), and C≥0 (hence, |C|=C), the gain $g_l$ may be computed as $g_l=|C|/a\cdot|L|$ where |·| denotes the absolute value of the amplitude, i.e., the magnitude or the envelope of the corresponding signal. Similarly, substituting $g_c=0$ in equation (42) and noting that S>0 (hence, |S|=S), and R<0 (hence, |R|=−R), the gain $g_s$ may be computed as $g_s=|R|/p\cdot|S|$. Combining these results yields $$g_l=\frac{|C|}{a\cdot|L|},\ g_c=0,\ g_s=\frac{|R|}{p\cdot|S|},\ \text{and } g_r=0 \text{ for } 0\le\alpha<90. \tag{43}$$

In a similar manner, choosing the appropriate equations from (35) through (42), the following results for segments II, III, and IV, respectively, may be derived:

$$g_l=\frac{|S|}{a\cdot|L|},\ g_c=\frac{|R|}{p\cdot|C|},\ g_s=0, \text{ and } g_r=0 \text{ for } 90\le\alpha<180. \tag{44}$$

$$g_l=0,\ g_c=\frac{|L|}{p\cdot|C|},\ g_s=0, \text{ and } g_r=\frac{|S|}{a\cdot|R|} \text{ for } 180\le\alpha<270. \tag{45}$$

$$g_l=0,\ g_c=0,\ g_s=\frac{|L|}{p\cdot|S|}, \text{ and } g_r=\frac{|C|}{a\cdot|R|} \text{ for } 270\le\alpha<360. \tag{46}$$

Figure 6A:
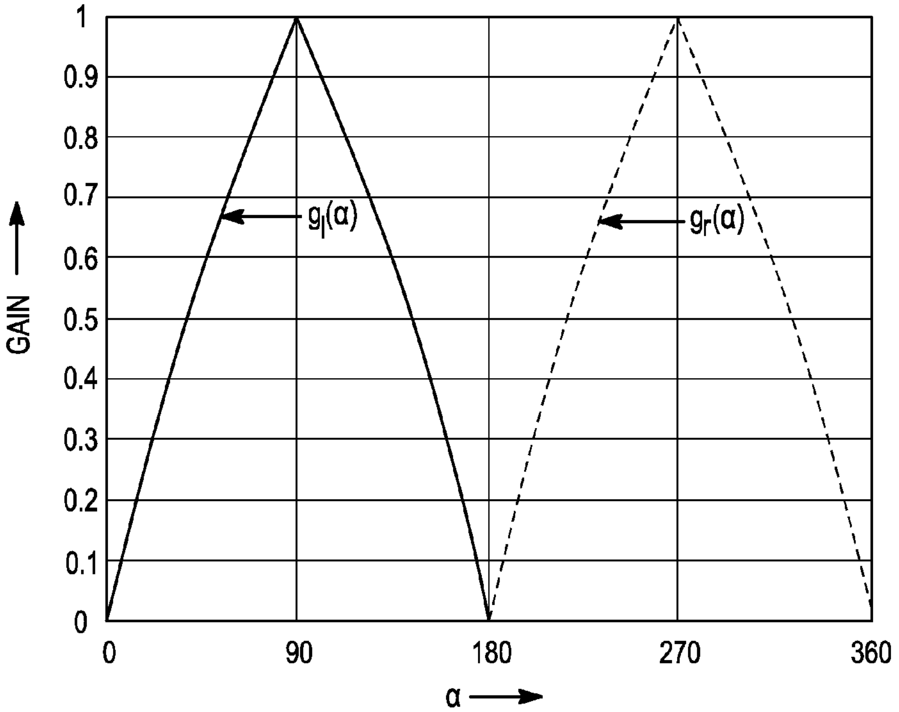
FIG. 6A is a graph showing the left and right gains $g_l$ and $g_r$ as a function of the panning angle $\alpha$ for the 4-output decoder.
Figure 6B:
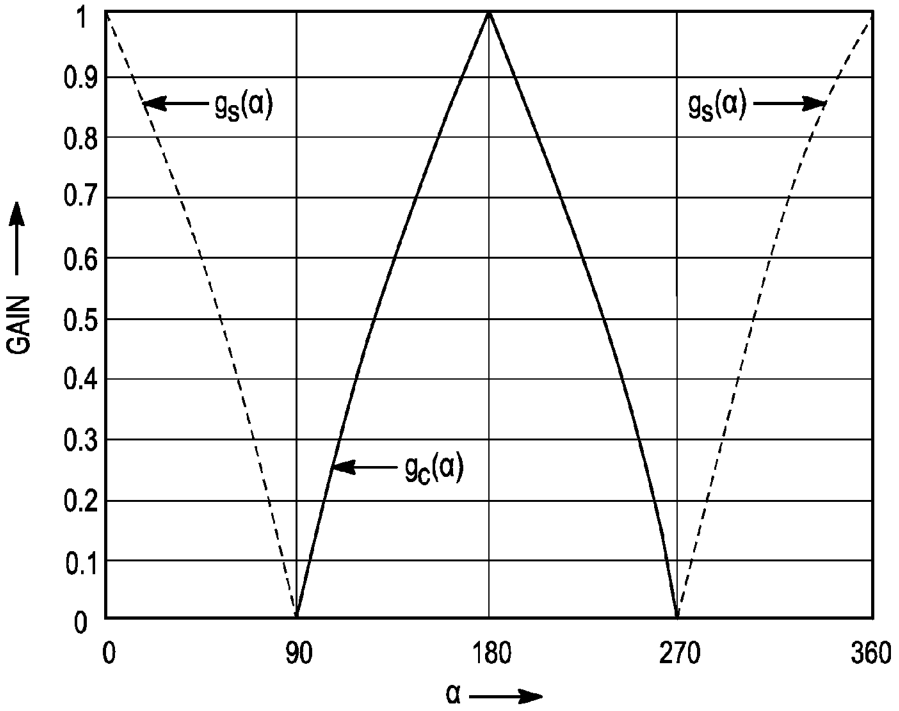
FIG. 6B is a graph showing the center and surround gains $g_c$ and $g_s$ as a function of the panning angle $\alpha$ for the 4-output decoder.

Equations (43) through (46) represent the appropriate gain values that can be used in the active matrix decoder of FIG. 2 to achieve optimum desired cross-talk cancellation for a source positioned at any angle θ≤α<360. Assuming $a=\sqrt{1/2}=0.707$, the gains $g_l(\alpha)$ and $g_r(\alpha)$ are plotted as a function of the panning angle α in FIG. 6A. Likewise, the gains g, (α) and $g_s(\alpha)$ are plotted as a function of α in FIG. 6B. From the gains $g_l$, $g_c$, $g_s$, and $g_r$, the coefficients of the active matrix H can be computed using equation (28).

Figure 7A:
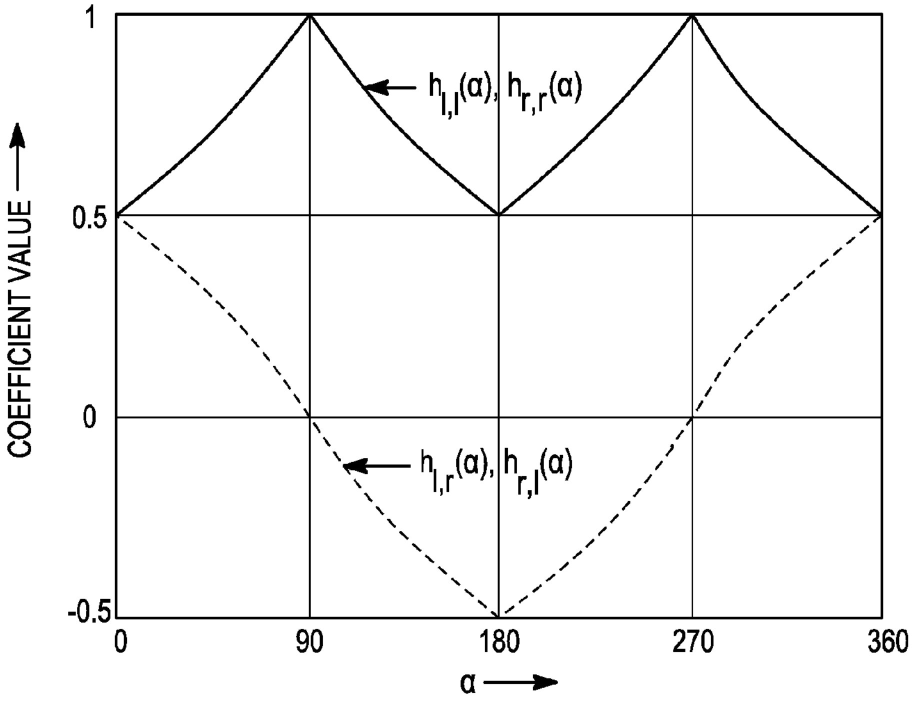
FIG. 7A is a graph showing the adaptive matrix coefficients for left ($h_{l,l}$ and $h_{l,r}$) and right ($h_{r,l}$ and $h_{r,r}$) outputs as a function of the panning angle $\alpha$ for the 4-output decoder.
Figure 7B:
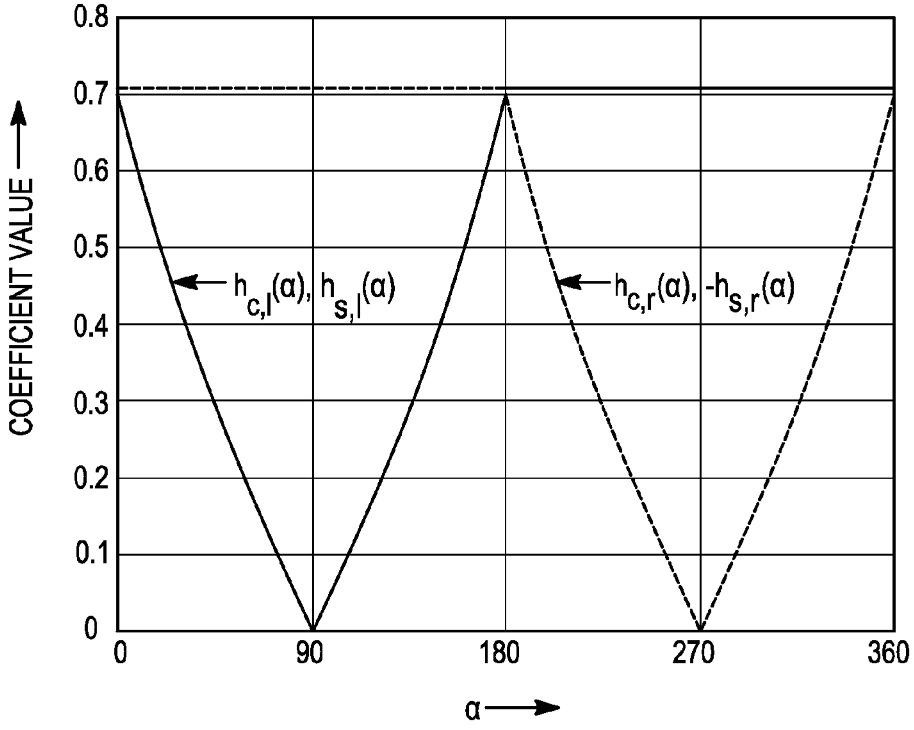
FIG. 7B is a graph showing the adaptive matrix coefficients for center ($h_{c,l}$ and $h_{l,r}$) and surround ($h_{s,l}$ and $h_{s,r}$) outputs as a function of the panning angle $\alpha$ for the 4-output decoder.

The coefficients $h_{l,l}(\alpha)$, $h_{l,r}(\alpha)$, $h_{r,l}(\alpha)$, and $h_{r,r}(\alpha)$ are plotted as a function of α in FIG. 7A. Similarly, the coefficients $h_{c,l}(\alpha)$, $h_{c,r}(\alpha)$, $h_{s,l}(\alpha)$, and $h_{s,r}(\alpha)$ are plotted as a function of a in FIG. 7B. In order to choose the appropriate equation from (43) through (46) for use in calculating the gains, the angular segment of the source signal (segment I, II, III, or IV) must be known. In this regard, a coarse directional cue may be obtained from the following ratios (in dB or decibels):

$$M_{l,r}=20\cdot\log_{10}\left(\frac{|L|+\delta}{|R|+\delta}\right), \text{ and} \tag{47}$$

$$M_{c,s}=20\cdot\log_{10}\left(\frac{|C|+\delta}{|S|+\delta}\right), \tag{48}$$

where δ>0 is any small positive constant (e.g. δ=0.0001) used to limit the maximum positive and negative values of the ratios, if desired. The following inequalities can then be used to identify the angular segments I, II, III, and IV, respectively:

$$M_{l,r}\ge 0, M_{c,s}<0 \text{ for } 0\le\alpha<90 \tag{49}$$

$$M_{l,r}>0, M_{c,s}\ge 0 \text{ for } 90\le\alpha<180 \tag{50}$$

$$M_{l,r}\le 0, M_{c,s}>0 \text{ for } 180\le\alpha<270 \tag{51}$$

and $$M_{l,r}<0, M_{c,s}\le 0 \text{ for } 270\le\alpha<360 \tag{52}$$

B.) Five Output Matrix Decoders

Figure 8:
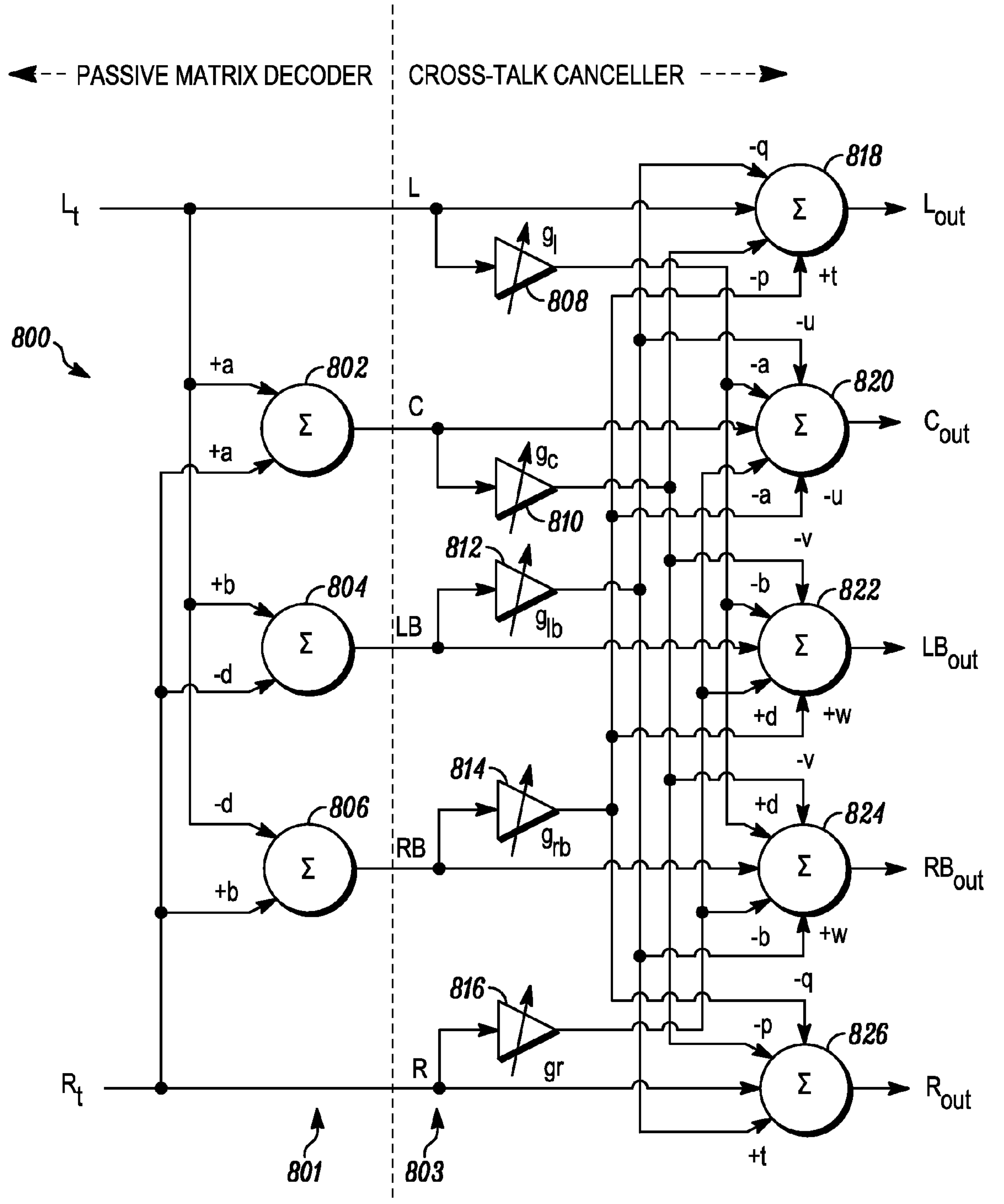
FIG. 8 is a schematic and functional diagram of an active matrix decoder with five outputs.

FIG. 8 shows a five output active matrix decoder 800 having a passive decoder circuit 801 including respective summers 802, 804, and 806, and a cross talk canceller circuit 803 including respective variable gain elements 808-816 and respective summers 818-826. The inputs to the decoder are the signals $L_t$ and $R_t$. From the inputs, the intermediate signals L, C, LB ("left back"), RB ("right back"), and R are formed using summers 802-806 and the scaling coefficients a, b, and d. The relationship between the inputs and the intermediate signals can be expressed as follows:

$$L=L_t \tag{53}$$

$$C=a\cdot(L_t+R_t) \tag{54}$$

$$LB=b\cdot L_t-d\cdot R_t \tag{55}$$

$$RB=b\cdot R_t-d\cdot L_t \tag{56}$$

and $$R=R_t \tag{57}$$

where a>0, and b>d>0 are scaling coefficients. The scaling coefficients are selected in such a way that the intermediate signals have the same maximum power as the input signals, namely, $2\cdot a^2=1$ or $a=\sqrt{1/2}=0.707$; and $b^2+d^2=1$, e.g., b=0.8718 and d=0.4899 for a principal direction of $\alpha=31.33°$ (or 328.67°). Equations (53) through (57) can also be expressed using vector notation as $$y=F\cdot x \tag{58}$$

where $$y=\begin{bmatrix} L \\ C \\ LB \\ RB \\ R \end{bmatrix}, \text{ and}$$

$$F=\begin{bmatrix} 1 & 0 \\ +a & +a \\ +b & -d \\ -d & +b \\ 0 & 1 \end{bmatrix}. \tag{59}$$

From the intermediate signals, the decoder outputs are formed using the variable gain elements 808-816, the summers 818-826, and the scaling coefficients a, b, d, p, q, t, u, v, and w. The variable gains associated with the intermediate signals L, C, LB, RB, and R are denoted respectively by $g_l$, $g_c$, $g_{lb}$, $g_{rb}$, and $g_r$. To form the output signal $L_{out}$, for example, the intermediate signal L, the intermediate signal C multiplied by the variable gain g, (element 810) and the scaling coefficient −p, the intermediate signal LB multiplied by the gain $g_{lb}$ (element 812) and the scaling coefficient −q, and the intermediate signal RB multiplied by the variable gain $g_{rb}$ (element 814) and the scaling coefficient +t are added together in the summer 818. The other outputs $C_{out}$, $LB_{out}$, $RB_{out}$, and $R_{out}$ are formed in a similar manner as shown in FIG. 8. The relationship between the intermediate signals and the outputs can be expressed by the following equations:

$$L_{out}=L-p\cdot g_c\cdot C-q\cdot g_{lb}\cdot LB+t\cdot g_{rb}\cdot RB \tag{60}$$

$$C_{out}=C-a\cdot g_l\cdot L-u\cdot g_{lb}\cdot LB-u\cdot g_{rb}\cdot RB-a\cdot g_r\cdot R \tag{61}$$

$$LB_{out}=LB-b\cdot g_l\cdot L-v\cdot g_c\cdot C+w\cdot g_{rb}\cdot RB+d\cdot g_r\cdot R \tag{62}$$

$$RB_{out}=RB+d\cdot g_l\cdot L-v\cdot g_c\cdot C+w\cdot g_{lb}\cdot LB-b\cdot g_{r\cdot R} \tag{63}$$

and $$R_{out}=R-p\cdot g_c\cdot C+t\cdot g_{lb}\cdot LB-q\cdot g_{rb}\cdot RB \tag{64}$$

where the scaling coefficients q>0, t>0, u>0, v>0, and w>0 are respectively given by $$q=\frac{b}{b^2+d^2}, \tag{65}$$

$$t=\frac{d}{b^2+d^2}, \tag{66}$$

$$u=\frac{a\cdot(b-d)}{b^2+d^2}, \tag{67}$$

$$v=\frac{(b-d)}{2\cdot a}, \text{ and} \tag{68}$$

$$w=\frac{2\cdot b\cdot d}{b^2+d^2}. \tag{69}$$

The scaling coefficient p>0 is given as before by equation (24). The scaling coefficients for the signals summed by the summers 818, 820, 822, 824, and 826 are selected in such a way that the gains $g_l$, $g_c$, $g_{lb}$, $g_{rb}$ and $g_r$ have a maximum value of unity.

Equations (60) through (64) can also be expressed using vector notation as $$z=G\cdot y \tag{70}$$

where $$z=\begin{bmatrix} L_{out} \\ C_{out} \\ LB_{out} \\ RB_{out} \\ R_{out} \end{bmatrix}, \text{ and}$$

$$G=\begin{bmatrix} 1 & -p\cdot g_c & -q\cdot g_{lb} & +t\cdot g_{rb} & 0 \\ -a\cdot g_l & 1 & -u\cdot g_{lb} & -u\cdot g_{rb} & -a\cdot g_r \\ -b\cdot g_l & -v\cdot g_c & 1 & +w\cdot g_{rb} & +d\cdot g_r \\ +d\cdot g_l & -v\cdot g_c & +w\cdot g_{lb} & 1 & -b\cdot g_r \\ 0 & -p\cdot g_c & +t\cdot g_{lb} & -q\cdot g_{rb} & 1 \end{bmatrix}. \tag{71}$$

Combining equations (9) and (25) yields $$z=G\cdot y=G\cdot F\cdot x=H\cdot x \tag{72}$$

where $$H=\begin{bmatrix} h_{l,l} & h_{l,r} \\ h_{c,l} & h_{c,r} \\ h_{lb,l} & h_{lb,r} \\ h_{rb,l} & h_{rb,r} \\ h_{r,l} & h_{r,r} \end{bmatrix}$$

$$=\begin{bmatrix} 1-p\cdot a\cdot g_c- & -p\cdot a\cdot g_c+ \\ q\cdot b\cdot g_{lb}\cdot t\cdot d\cdot g_{rb} & q\cdot d\cdot g_{lb}+t\cdot b\cdot g_{rb} \\ +a\cdot(1-g_l)- & +a\cdot(1-g_r)+ \\ u\cdot b\cdot g_{lb}+u\cdot d\cdot g_{rb} & u\cdot d\cdot g_{lb}-u\cdot b\cdot g_{rb} \\ +b\cdot(1-g_l)- & -d\cdot(1-g_r)- \\ v\cdot a\cdot g_c-w\cdot d\cdot g_{rb} & v\cdot a\cdot g_c+w\cdot b\cdot g_{rb} \\ -d\cdot(1-g_l)- & +b\cdot(1-g_r)- \\ v\cdot b\cdot g_{lb}+u\cdot d\cdot g_{lb} & v\cdot a\cdot g_c-w\cdot d\cdot g_{lb} \\ -p\cdot a\cdot g_c+ & 1-p\cdot a\cdot g_c- \\ t\cdot b\cdot g_{lb}+q\cdot d\cdot g_{rb} & t\cdot d\cdot g_{lb}-q\cdot b\cdot g_{rb} \end{bmatrix}$$

As in the four output case, the active matrix H is composed of the passive matrix F and the matrix G. Correspondingly, the diagram in FIG. 8 has a "passive matrix decoder" stage 801 and a "cross-talk canceller" stage 803. If the gains $g_l$, $g_c$, $g_{lb}$, $g_{rb}$ and $g_r$ are all selected to be zero, the matrix G is simply an identity matrix and the active matrix H degenerates into the passive matrix F.

Figure 9:
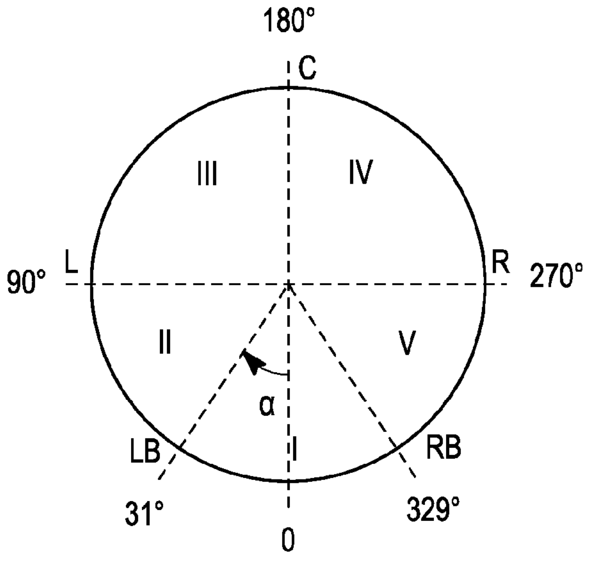
FIG. 9 is a schematic diagram showing the angular positions corresponding to the five outputs of the decoder in FIG. 8.
Figure 10:
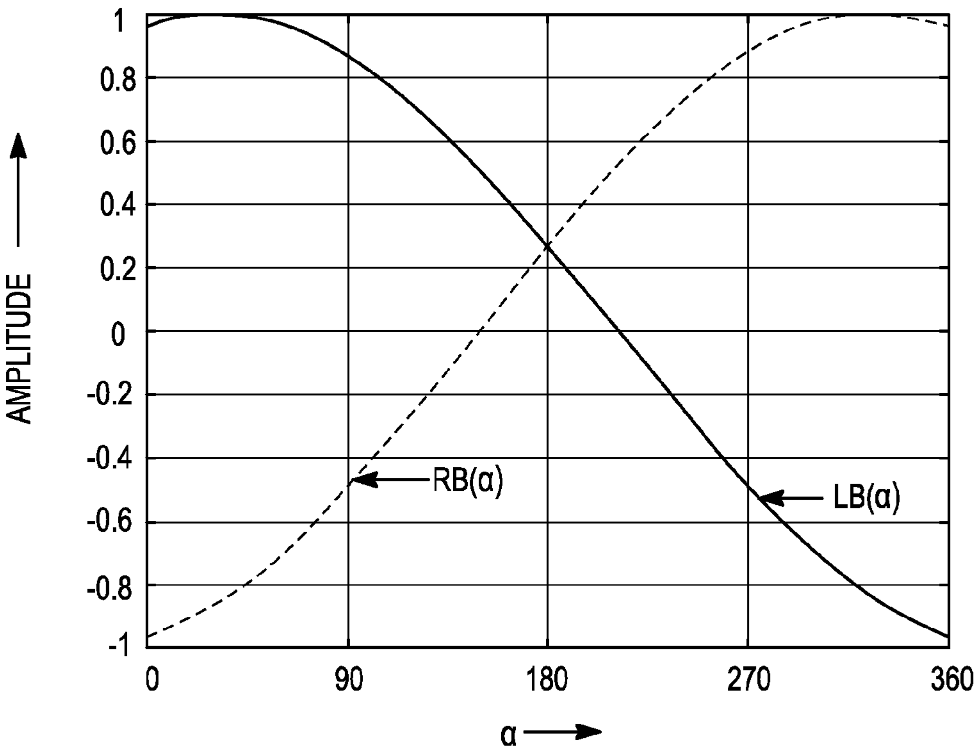
FIG. 10 is a graph showing the relative magnitudes and polarities of the intermediate signals LB and RB as a function of the panning angle $\alpha$ (in degrees)

The principal directions associated with a typical five output "surround system" are shown in FIG. 9. These are "left back" ($\alpha$=31.33°), "left" ($\alpha$=90°), "center" ($\alpha$=180°), "right" ($\alpha$=270°), and "right back" ($\alpha$=328.67°). Correspondingly, there are five angular segments denoted by segment I composed of sub-segments ($328.67\le\alpha<360$) and ($0\le\alpha<31.33$), segment II ($31.33\le\alpha<90$), segment III ($90\le\alpha<180$), segment IV ($180\le\alpha<270$), and segment V ($270\le\alpha<328.67$). In an embodiment, the "left back" and "right back" positions are set forth and back by 31.33° from the "surround" ($\alpha$=0°) position, although the magnitude of the angular displacement (e.g., ±31.33°) is not critical. However, for this choice, conveniently $M_{l,r}\approx\pm5$ dB and $M_{c,s}\approx-11$ dB. The behavior of the intermediate signals L, R, and C is depicted in the graphs of FIG. 4A and FIG. 4B as $\alpha$ varies from 0° to 360°. The behavior of the signals LB and RB as a function of the panning angle $\alpha$ is shown in the graphs of FIG. 10, where b=0.8718 and d=0.4899. Note that these signals reach their maximum amplitude of unity at $\alpha$=31.33° and $\alpha$=328.67°, respectively.

Figure 11:
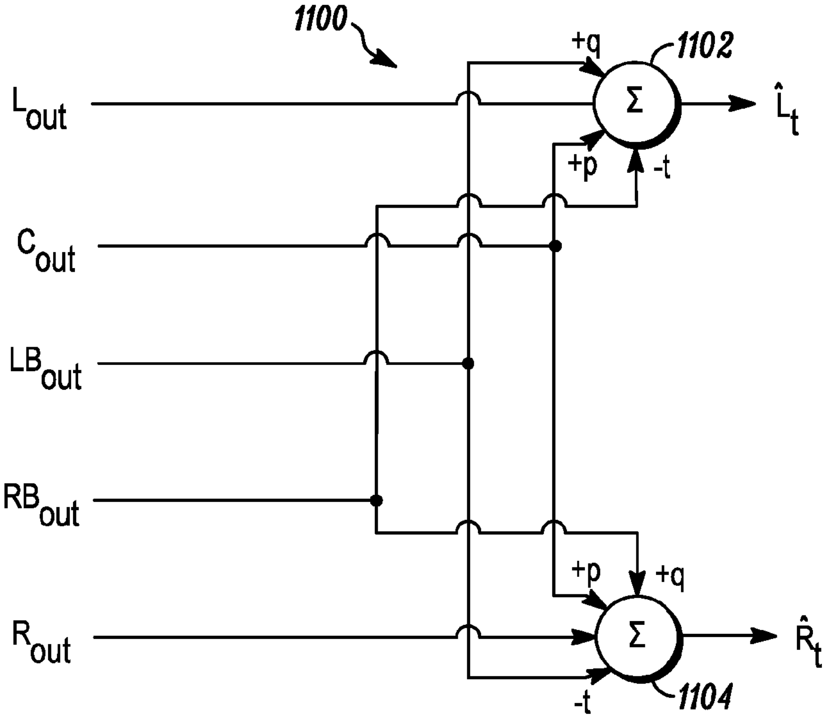
FIG. 11 is a functional and schematic diagram of a (5×2) matrix encoder useful in deriving some additional relationships between certain intermediate signals within the active matrix decoder of FIG. 8.

FIG. 11 shows an encoder 1100 having respective summers 1102, 1104 which take, as inputs, the outputs of the decoder 800 (FIG. 8), namely, $L_{out}$, $C_{out}$, $LB_{out}$, $RB_{out}$, and $R_{out}$. Encoder 1100 re-encodes signals $L_{out}$, $C_{out}$, $LB_{out}$, $RB_{out}$, and $R_{out}$ into outputs $\hat{L}_t$ and $\hat{R}_t$. The relationship between the inputs and outputs of encoder 1100 can be expressed by the following equations:

$$\hat{L}_t=L_{out}+p\cdot C_{out}+q\cdot LB_{out}-t\cdot RB_{out} \quad (73)$$

and $$\hat{R}_t=R_{out}+p\cdot C_{out}-t\cdot LB_{out}+q\cdot RB_{out} \quad (74)$$

The scaling coefficients for the signals summed by the summers 1102 and 1104 in FIG. 11 are selected in such a way that the encoded signals will have the same power as the input signals to the decoder 800. Equations (73) and (74) may also be expressed using vector notation as $$\hat{x}=E\cdot z \quad (75)$$

where $$E=\begin{bmatrix}1 & +p & +q & -t & 0\\ 0 & +p & -t & +q & 1\end{bmatrix}$$

is the encoding matrix.

Substituting equations (60) through (64) in (73) and (74), simplifying, and requiring that $\hat{L}_t=L_t$ and $\hat{R}_t=R_t$, the following necessary conditions are obtained:

$$(p\cdot a+q\cdot b+t\cdot d)\cdot g_l\cdot L+(p+q\cdot v-t\cdot v)\cdot g_c\cdot C+(q+p\cdot u+t\cdot w)\cdot g_{lb}\cdot LB+(-t+p\cdot u-q\cdot w)\cdot g_{rb}\cdot RB+(p\cdot a-q\cdot d-t\cdot b)\cdot g_r\cdot R=p\cdot C+q\cdot LB-t\cdot RB \quad (76)$$

and $$(p\cdot a-q\cdot d-t\cdot d)\cdot g_l\cdot L+(p+q\cdot v-t\cdot v)\cdot g_c\cdot C+(-t+p\cdot u-q\cdot w)\cdot g_{lb}\cdot LB+(q+p\cdot u+t\cdot w)\cdot g_{rb}\cdot RB+(p\cdot a+q\cdot b+t\cdot d)\cdot g_r\cdot R=p\cdot C-t\cdot LB+q\cdot RB \quad (77)$$

As in the four output case, the output equations (60) through (64) for decoder 800 maybe re-written with the outputs set to zero, resulting in $$L-p\cdot g_c\cdot C-q\cdot g_{lb}\cdot LB+t\cdot g_{rb}\cdot RB=0 \quad (78)$$

$$C-a\cdot g_l\cdot L-u\cdot g_{lb}\cdot LB-u\cdot g_{rb}\cdot RB-a\cdot g_r\cdot R=0 \quad (79)$$

$$LB-b\cdot g_l\cdot L-v\cdot g_c\cdot C+w\cdot g_{rb}\cdot RB+d\cdot g_r\cdot R=0 \quad (80)$$

$$RB+d\cdot g_l\cdot L-v\cdot g_c\cdot C+w\cdot g_{lb}\cdot LB-b\cdot g_r\cdot R=0 \quad (81)$$

and $$R-p\cdot g_c\cdot C+t\cdot g_{lb}\cdot LB-q\cdot g_{rb}\cdot RB=0 \quad (82)$$

For a single source positioned in any given direction $\alpha$, at most two of the outputs will be non-zero (pair-wise panpotting). Thus, at least three of the outputs will be zero, i.e., three of the five equations (78) through (82) will be valid. The combination of these three equations and the necessary conditions specified by equations (76) and (77) results in five simultaneous linear equations.

Figure 12A:
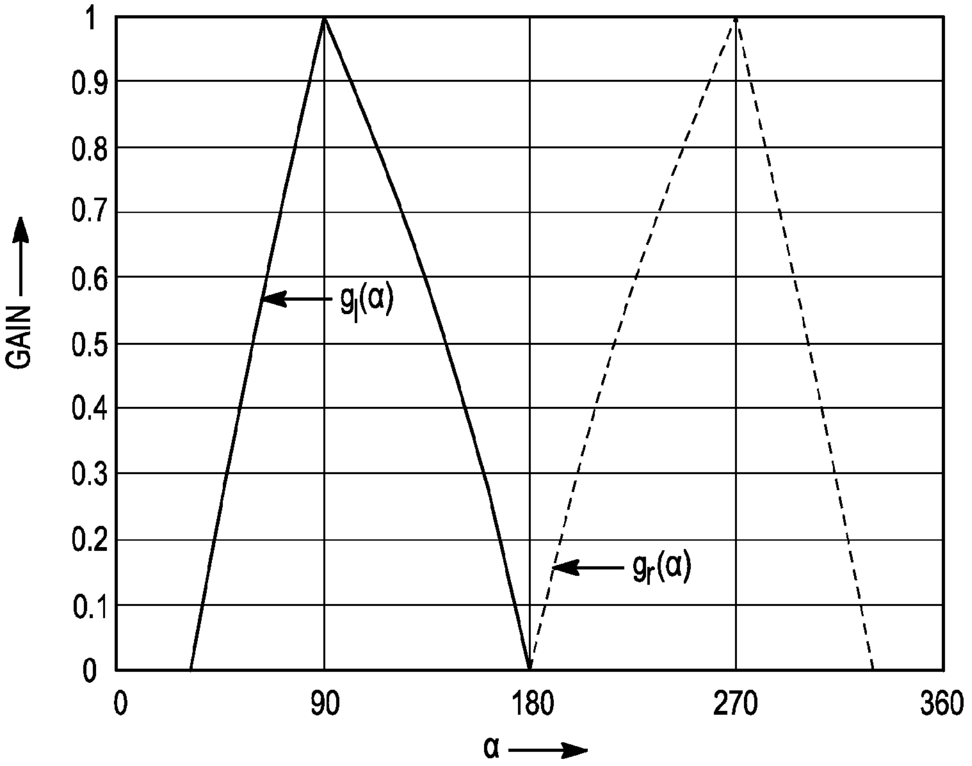
FIG. 12A is a graph showing the left and right gains $g_l$ and $g_r$ as a function of the panning angle $\alpha$ for the 5-output decoder.
Figure 12B:
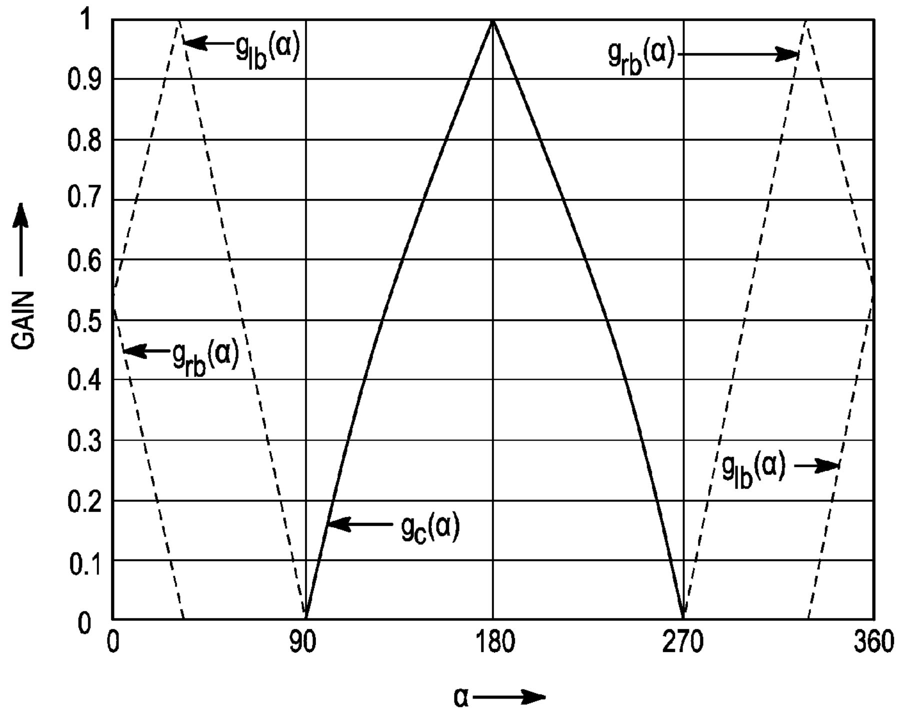
FIG. 12B is a graph showing the center, left back, and right back gains $g_c$, $g_{lb}$, and $g_{rb}$ as a function of the panning angle $\alpha$ for the 5-output decoder.

This system of equations can be solved using standard, well known methods from linear algebra to compute the gains $g_l$, $g_c$, $g_{lb}$, $g_{rb}$ and $g_r$ for any angle $\alpha$. This was done for $0\le\alpha<360$ and the resulting gains are shown in FIG. 12A and FIG. 12B using scaling coefficient values of a=0.707, b=0.8718 and d=0.4899. The gains $g_l$ ($\alpha$) and $g_r$ ($\alpha$) are plotted as a function of the panning angle $\alpha$ in FIG. 12A. Likewise, the gains $g_c$ ($\alpha$), $g_{lb}$ ($\alpha$) and $g_{rb}$ ($\alpha$) are plotted as a function of $\alpha$ in FIG. 12B. From the graphs in FIG. 12A and FIG. 12B, it is seen that a gain is non-zero only in those directions for which the corresponding output is expected to be non-zero, i.e., it is one of the outputs near the source.

For example, the gain $g_l$ ($\alpha$) is non-zero for the range $31.33\le\alpha<180$ and the corresponding output $L_{out}$ is expected to be non-zero for that range because it is one of the closest outputs for this range of $\alpha$. This observation can be used to simplify the solution of the system of equations, as illustrated below.

For example, consider segment I composed of sub-segments ($328.67\le\alpha<360$) and ($0\le\alpha<31.33$). In this segment, $L_{out}=C_{out}=R_{out}=0$ so that equations (78), (79), and (82) are valid. Also, from the above observation, $g_l=g_c=g_r=0$ in this segment. Substituting $g_c$=0 in equations (78) and (82), we obtain $$q\cdot g_{lb}\cdot LB-t\cdot g_{rb}\cdot RB=L \quad (83)$$

and $$-t\cdot g_{lb}\cdot LB+q\cdot g_{rb}\cdot RB=R \quad (84)$$

In sub-segment ($328.67\le\alpha<360$), from the graphs in FIG. 4A and FIG. 10, L<0 (hence, |L|=−L), LB<0 (hence, |LB|=−LB), RB>0 (hence, |RB|=RB), and R>0 (hence, |R|=R). For this sub-segment, equations (83) and (84) can be rewritten as $$-q\cdot g_{lb}\cdot|LB|-t\cdot g_{rb}\cdot|RB|=-|L|$$

and $$t\cdot g_{lb}\cdot|LB|+q\cdot g_{rb}\cdot|RB|=|R|$$

In sub-segment ($0\le\alpha<31.33$), from the graphs in FIG. 4A and FIG. 10, L>0 (so, |L|=L), LB>0 (hence, |LB|=LB), RB<0 (hence, |RB|=−RB), and R<0 (hence, |R|=−R). For this sub-segment, equations (83) and (84) can be rewritten as $$q\cdot g_{lb}\cdot|LB|+t\cdot g_{rb}\cdot|RB|=|L|$$

and $$-t\cdot g_{lb}\cdot|LB|-q\cdot g_{rb}\cdot|RB|=-|R|$$

So, for either sub-segment, i.e., for segment I, equations (83) and (84) may be re-written as $$q\cdot g_{lb}\cdot|LB|+t\cdot g_{rb}\cdot|RB|=|L| \tag{85}$$

and $$t\cdot g_{lb}\cdot|LB|-q\cdot g_{rb}\cdot|RB|=|R| \tag{86}$$

This second order system can be solved to obtain the gain values $g_{lb}$ and $g_{rb}$. Accordingly, we have the following results for segment I:

$$g_l=0,\ g_c=0,\ g_{lb}=\frac{q\cdot|RB|\cdot|L|-t\cdot|RB|\cdot|R|}{(q^2-t^2)\cdot|LB|\cdot|RB|},\ g_{rb}=\frac{q\cdot|LB|\cdot|R|-t\cdot|LB|\cdot|L|}{(q^2-t^2)\cdot|LB|\cdot|RB|},\text{ and } g_r=0 \text{ for } (328.67\le\alpha<360) \text{ and } (0\le\alpha<31.33). \tag{87}$$

Using a similar approach, the results for segments II, III, IV, and V can be obtained, respectively, as:

$$g_l=\frac{t\cdot|C|-u\cdot|R|}{t\cdot a\cdot|L|},\ g_c=0,\ g_{lb}=\frac{|R|}{t\cdot|LB|},\ g_{rb}=0,\text{ and } g_r=0 \text{ for } 31.33\le\alpha\le 90. \tag{88}$$

$$g_l=\frac{p\cdot|LB|-v\cdot|R|}{p\cdot b\cdot|L|},\ g_c=\frac{|R|}{p\cdot|C|},\ g_{rb}=0,\ g_{rb}=0,\text{ and } g_r=0 \text{ for } 90\le\alpha<180. \tag{89}$$

$$g_l=0,\ g_c=\frac{|L|}{p\cdot|C|},\ g_{lb}=0,\ g_{rb}=0,\text{ and } g_r=\frac{p\cdot|RB|-v\cdot|L|}{p\cdot b\cdot|R|} \text{ for } 180\le\alpha<270. \tag{90}$$

$$g_l=0,\ g_c=0,\ g_{lb}=0,\ g_{rb}=\frac{|L|}{t\cdot|Rb|},\text{ and } g_r=\frac{t\cdot|C|-u\cdot|L|}{t\cdot a\cdot|R|} \text{ for } 270\le\alpha<328.67. \tag{91}$$

Figure 13A:
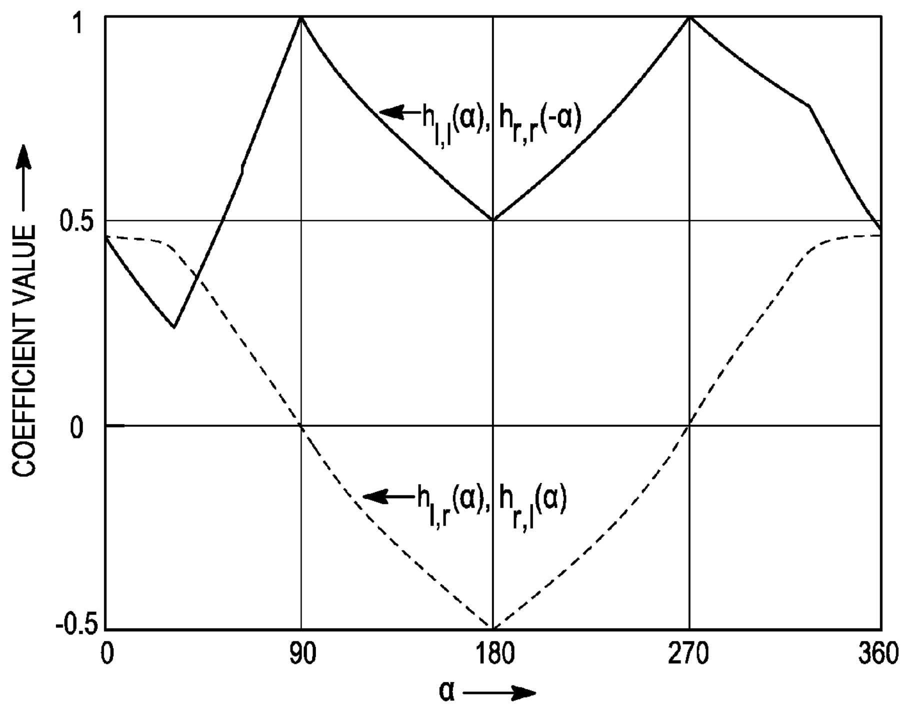
FIG. 13A is a graph showing the adaptive matrix coefficients for left ($h_{l,l}$ and $h_{l,r}$) and right ($h_{r,l}$ and $h_{r,r}$) outputs as a function of the panning angle $\alpha$ for the 5-output decoder.
Figure 13B:
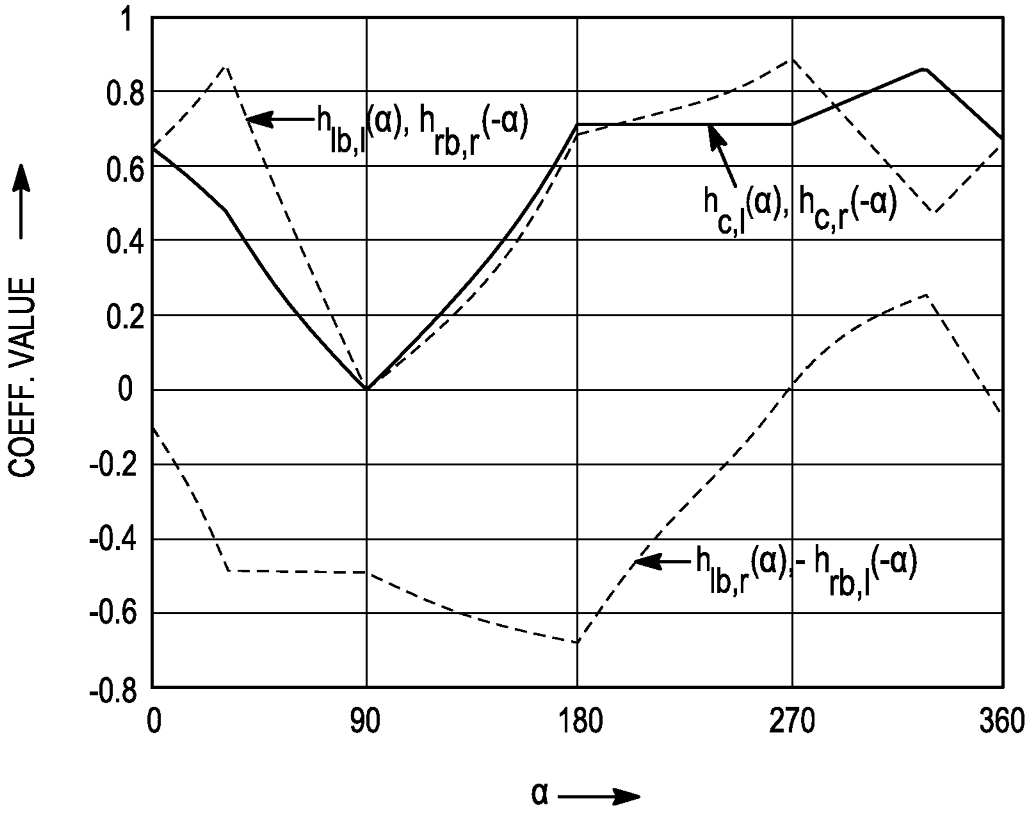
FIG. 13B is a graph showing the adaptive matrix coefficients for center ($h_{c,l}$ and $h_{c,r}$), left back ($h_{lb,l}$ and $h_{lb,r}$), and right back ($h_{rb,l}$ and $h_{rb,r}$) outputs as a function of the panning angle $\alpha$.

Equations (87) through (91) represent the appropriate gains that can be used in the active matrix decoder of FIG. 8 to achieve cross-talk cancellation for any source angle 0≤t<360. From the gains $g_l$, $g_c$, $g_{lb}$, $g_{rb}$, and $g_r$, the coefficients of the active matrix H can be computed using equation (72). The coefficients $h_{l,l}(\alpha)$, $h_{l,r}(\alpha)$, $h_{r,l}(\alpha)$, and $h_{r,r}(\alpha)$ are plotted as a function of α in FIG. 13A. Similarly, the coefficients $h_{c,l}(\alpha)$, $h_{c,r}(\alpha)$, $h_{lb,l}(\alpha)$, $h_{lb,r}(\alpha)$, $h_{rb,l}(\alpha)$, and $h_{rb,r}(\alpha)$ are plotted as a function of a in FIG. 13B. In order to choose the appropriate equation from (87) through (91) and calculate the gains, the angular segment of the source signal, that is, segment I, II, III, IV or V must be determined or inferred. In this regard, a coarse directional cue can be obtained from the ratios $M_{l,r}$ and $M_{c,s}$ using the following inequalities:

$$M_{l,r}<0.0,\ M_{c,s}\le\left(\frac{11}{5}\right)M_{l,r} \text{ and } M_{l,r}\ge 0.0,\ M_{c,s}<\left(\frac{-11}{5}\right)M_{l,r} \text{ for } (328.67\le\alpha<360) \text{ and } (0\le\alpha<31.33), \tag{92}$$

$$M_{l,r}>0.0,\ \left(\frac{-11}{5}\right)M_{l,r}\le M_{c,s}<0 \text{ for } 31.33\le\alpha<90, \tag{93}$$

-continued $$M_{l,r}>0,\ M_{c,s}\ge 0 \text{ for } 90\le\alpha<180, \tag{94}$$

$$M_{l,r}\le 0,\ M_{c,s}>0 \text{ for } 180\le\alpha<270, \text{ and} \tag{95}$$

$$M_{l,r}<0.0,\ \left(\frac{11}{5}\right)M_{l,r}<M_{c,s}\le 0 \text{ for } 270\le\alpha<328.67. \tag{96}$$

In expressing the above inequalities, it is anticipated that the ratios $M_{l,r}$ and $M_{c,s}$ may not attain their ideal values in a practical system and in that event, the two ratios are assumed to be proportionately affected; in other words, the ratio of ratios is assumed to be constant for any given α.

C.) N Output Matrix Decoders

A general N (>2) output matrix decoder can be designed essentially using the same approach discussed above for the four output and five output matrix decoders. An active matrix decoder with N outputs composed of a passive matrix decoder stage and a cross-talk canceller stage may be designed in a straightforward manner using the principles discussed above.

More particularly, the scaling coefficients of the passive matrix decoder stage can be selected such that the intermediate signals rise to a maximum of unity at each cardinal direction. The scaling coefficients at the output summers can be chosen such that for each cardinal direction the choice of the corresponding gain as unity and the remaining gains as zero would result in substantial or complete cross-talk cancellation. An encoder can then be designed which uses the decoder outputs as inputs and re-encodes them. The scaling coefficients at the output summers of the encoder stage can be selected such that, for each cardinal direction, the outputs of the encoder match the inputs of the decoder, assuming complete cross-talk cancellation at the decoder stage.

The N equations relating the decoder intermediate signals (i.e., the outputs of the passive matrix decoder stage) to the decoder outputs can be formulated. The two encoder equations relating its outputs to the decoder intermediate signals can also be formulated. By requiring that each of the encoder outputs match the corresponding decoder inputs, the two "necessary condition" equations relating the intermediate variables and the unknown gain terms may be determined.

By setting the decoder outputs equal to zero, a set of N equations are provided, of which only (N−2) are valid for any angle α. Combining these (N−2) equations with the two necessary condition equations results in a system of N simultaneous linear equations involving N unknowns. Using standard, well known linear algebra methodology, this system of equations may be solved to obtain the gain values. These gain values, when used in the active matrix decoder, provide the desired cross-talk cancellation.

D.) Implementation

Figure 14:
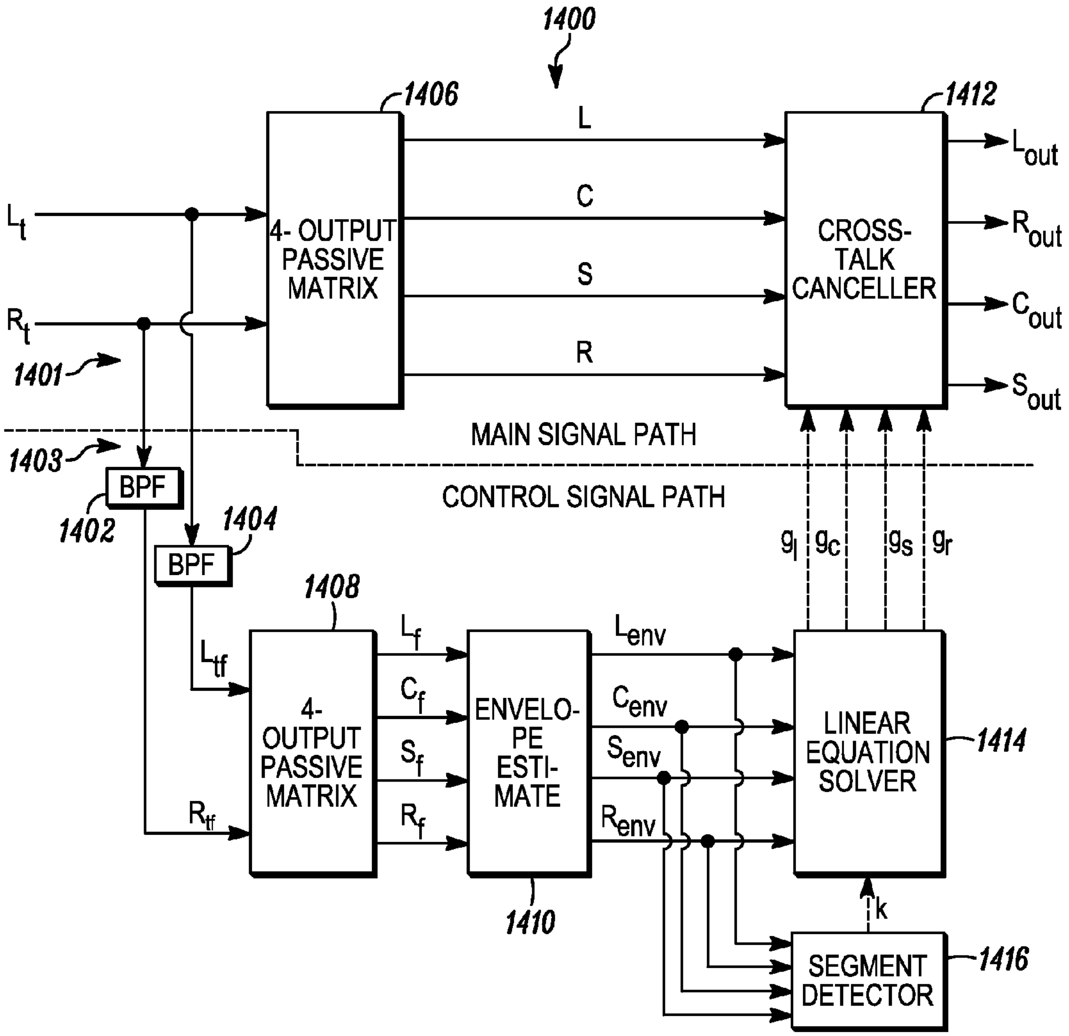
FIG. 14 is a functional system block diagram of a preferred embodiment with four outputs.

A preferred implementation of an exemplary four output active matrix decoder according to an embodiment of the present disclosure is shown in FIG. 14. More particularly, an active matrix decoder circuit 1400 includes a main signal circuit (or main signal path) 1401 and a control signal circuit (control signal path) 1403. Main signal path 1401 is composed of a four output passive matrix decoder module 1406 and a cross talk canceller module 1412. Control signal path 1403 is composed of a first band pass filter module 1402, a second band pass filter module 1404, a passive matrix decoder module 1408, an envelope estimator module 1410, a linear equation solver module 1414, and a segment detector module 1416.

The inputs to the decoder circuit 1400 are the signals $L_t$ and $R_t$. In the main signal path, these signals are fed into the 4-output passive matrix decoder block 1406 to generate the intermediate signals L, C, S, and R according to equations (1) through (4). The intermediate signals are fed into the cross talk canceller block 1412 to generate the outputs $L_{out}$, $C_{out}$, $S_{out}$, and $R_{out}$ according to equations (20) through (23). The 4-output passive matrix decoder module 1406 and the cross talk canceller module 1412 together form an active matrix decoder such as that shown in FIG. 2. The variable gains $g_l$, $g_c$, $g_s$, and $g_r$ which are fed into the cross-talk canceller block 1412 are computed in accordance with the present disclosure in the control signal path, as discussed in greater detail below.

In the control signal circuit 1403, the input signals $L_t$ and $R_t$ are applied to the band-pass filter blocks 1402 and 1404 to obtain the filtered signals $L_{tf}$ and $R_{tf}$, respectively. The band-pass filters are advantageously configured to limit the signal frequencies to within a range of approximately 200 Hz to 13500 Hz. Frequencies outside of this range are considered unimportant for human directional perception. The filtered input signals $L_{tf}$ and $R_{tf}$ are fed into the 4-output passive matrix decoder block 1408 to generate filtered versions of the intermediate signals, namely, $L_f$, $C_f$, $S_f$, and $R_f$. Passive decoder 1408 is functionally similar to decoder module 1406, i.e., it uses equations (1) through (4) to compute its outputs.

The filtered intermediate signals $L_f$, $C_f$, $S_f$, and $R_f$ are applied to the envelope estimator block 1410 to generate the signal envelopes $L_{env}$, $C_{env}$, $S_{env}$, and $R_{env}$. To estimate an envelope, e.g., $L_{env}$, the corresponding signal $L_f$ is first rectified by a full-wave rectifier, i.e., its absolute value $|L_f|$ is computed, and then filtered by a first order filter. In a digital implementation, this type of filter may be expressed by the following equation:

$$L_{env}(n)=\lambda\cdot L_{env}(n-1)+(1-\lambda)\cdot|L_f| \tag{97}$$

where n is the sample index and $\lambda<1$ (but close to 1) is a coefficient computed from the filter time constant and the sampling frequency, as is well known in the art. Since the lowest signal frequency in the full-wave rectified signal is preferably in the range of about 400 Hz (corresponding to a period of 2.5 milliseconds), a filter time constant in the range of about 10 to 25 milliseconds is sufficient to obtain a smooth signal envelope.

The signal envelopes $L_{env}$, $C_{env}$, $S_{env}$, and $R_{env}$, are fed into the linear equation solver block 1414 and the segment detector block 1416. The segment detector block 1616 preferably uses equations (47) and (48) as well as the inequalities (49) through (52) to detect the appropriate segment k from the set {I, II, III, IV}. Depending on the detected segment k, the linear equation solver module uses equations (43) through (46) to compute the gains $g_l$, $g_c$, $g_s$, and $g_r$ which are fed into the cross-talk canceller module 1412. That is, for each segment k (corresponding to panning angle regions I, II, III, and IV), linear equation solver block 1414 uses the appropriate equation (s) from equations (43) through (46) to compute the gain for that segment.

Optionally, the computed gains $g_l$, $g_c$, $g_s$, and $g_r$ can be smoothed by a first order filter of the form specified by equation (97) using a filter time constant of about 10 milliseconds before being fed into the cross-talk canceller module 1412. The gains $g_l$, $g_c$, $g_s$, and $g_r$ may be set to an initial default value of zero, in which case the intermediate signals L, C, S, and R directly form the outputs $L_{out}$, $C_{out}$, $S_{out}$, and $R_{out}$.

Figure 15:
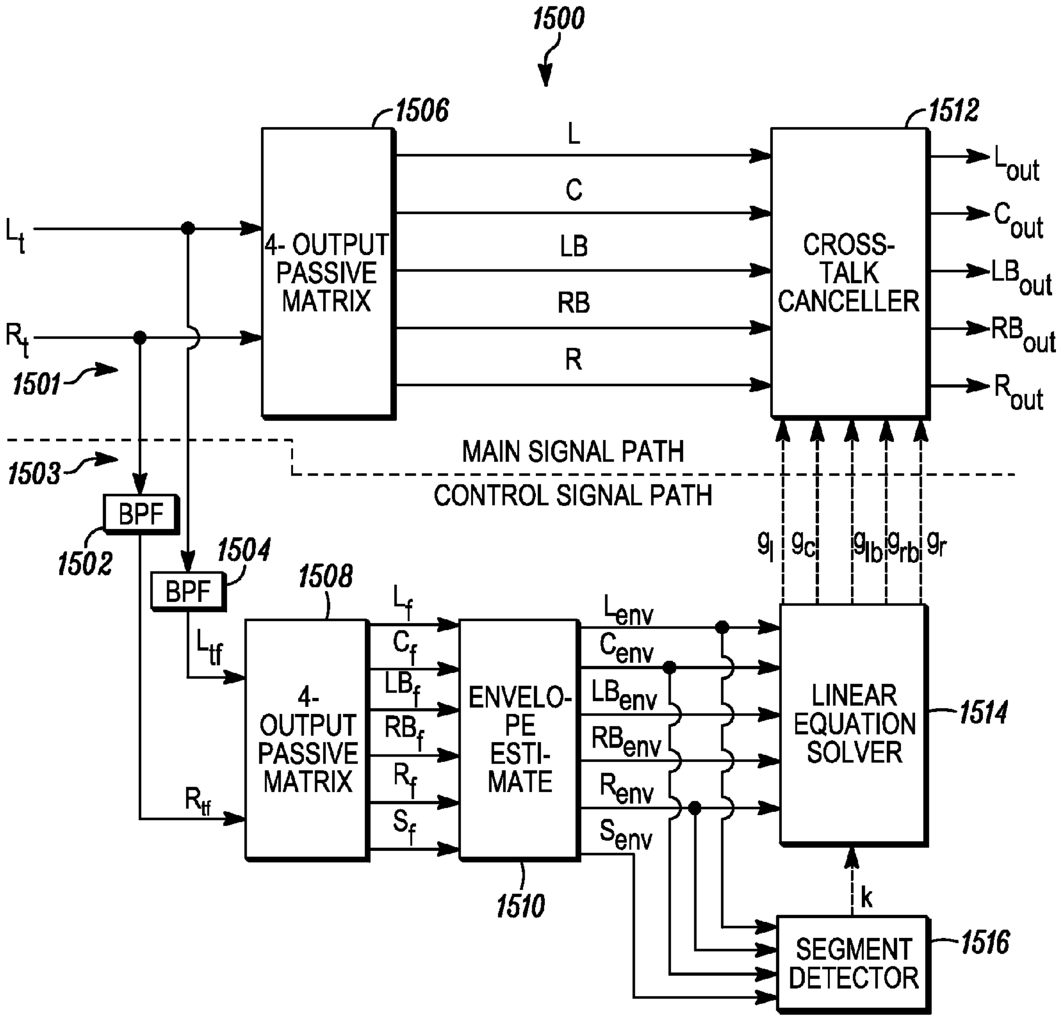
FIG. 15 is a functional system block diagram of a preferred embodiment with five outputs.

A preferred implementation of an exemplary five output active matrix decoder according to an embodiment of the present disclosure is shown in the block diagram of FIG. 15. More particularly, an active matrix decoder circuit 1500 includes a main signal circuit (or main signal path) 1501 and a control signal circuit (control signal path) 1503. Main signal circuit 1501 is composed of a five output passive matrix decoder 1506 and a cross talk canceller 1512. Control signal circuit 1503 is composed of a first band pass filter module 1502, a second band pass filter module 1504, a passive matrix decoder module 1508, an envelope estimator module 1510, a linear equation solver module 1514, and a segment detector module 1516.

The inputs to the decoder circuit 1500 are the signals $L_t$ and $R_t$. In the main signal path, the input signals $L_t$ and $R_t$ are fed into the 5-output passive matrix decoder block (module) 1506 to generate the intermediate signals L, C, LB, RB, and R according to equations (53) through (57). The intermediate signals are fed into the cross-talk canceller block 1512 to generate the outputs $L_{out}$, $C_{out}$, $LB_{out}$, $RB_{out}$, and $R_{out}$, according to equations (60) through (64).

The 5-output passive matrix decoder module 1506 and the cross-talk canceller module 1512 together form an active matrix decoder such as that shown in FIG. 8. The variable gains $g_l$, $g_c$, $g_{lb}$, $g_{rb}$, and $g_r$ are computed according to the present disclosure in the control signal path and fed into the cross-talk canceller, as described in greater detail below.

In the control signal circuit 1503, the input signals $L_t$ and $R_t$ are applied to the band-pass filter blocks 1502 and 1504 to obtain the filtered signals $L_{tf}$ and $R_{tf}$, respectively. The filtered input signals $L_{tf}$ and $R_{tf}$ are fed into the 6-output passive matrix decoder block 1508 to generate the filtered versions of the intermediate signals, namely, $L_f$, $C_f$, $LB_f$, $RB_f$, and $R_f$. Decoder module 1508 is also configured to generate a filtered version of the passive "surround" signal $S_f$.

The 6-output matrix decoder module 1508 uses equations (53) through (57) and equation (3) to compute its outputs. The filtered intermediate signals are applied to the envelope estimator block 1510 to generate the signal envelopes $L_{env}$, $C_{env}$, $S_{env}$, $LB_{env}$, $RB_{env}$, and $R_{env}$. The signal envelopes $L_{env}$, $C_{env}$, $LB_{env}$, $RB_{env}$, and $R_{env}$ are fed into the linear equation solver block 1514, and the envelopes $L_{env}$, $C_{env}$, $S_{env}$, and $R_{env}$ are fed into the segment detector block 1516.

The segment detector block 1516 uses equations (47) and (48) as well as the inequalities (92) through (96) to detect the appropriate segment k from the set {I, II, III, IV, V}. Depending on the detected segment k, the linear equation solver 1514 uses equations (87) through (91) to compute the gains $g_l$, $g_c$, $g_{lb}$, $g_{rb}$, and $g_r$ which are fed into the cross-talk canceller module 1512. Optionally, the computed gains $g_l$, $g_c$, $g_{lb}$, $g_{rb}$, and $g_r$ can be smoothed by a first order filter using a filter time constant in the range of about 10 milliseconds. By default, the gains $g_l$, $g_c$, $g_{lb}$, $g_{rb}$, and $g_r$ are set to zero, in which case the intermediate signals L, C, LB, RB, and R directly form the outputs $L_{out}$, $C_{out}$, $LB_{out}$, $RB_{out}$, and $R_{out}$.

Figure 16:
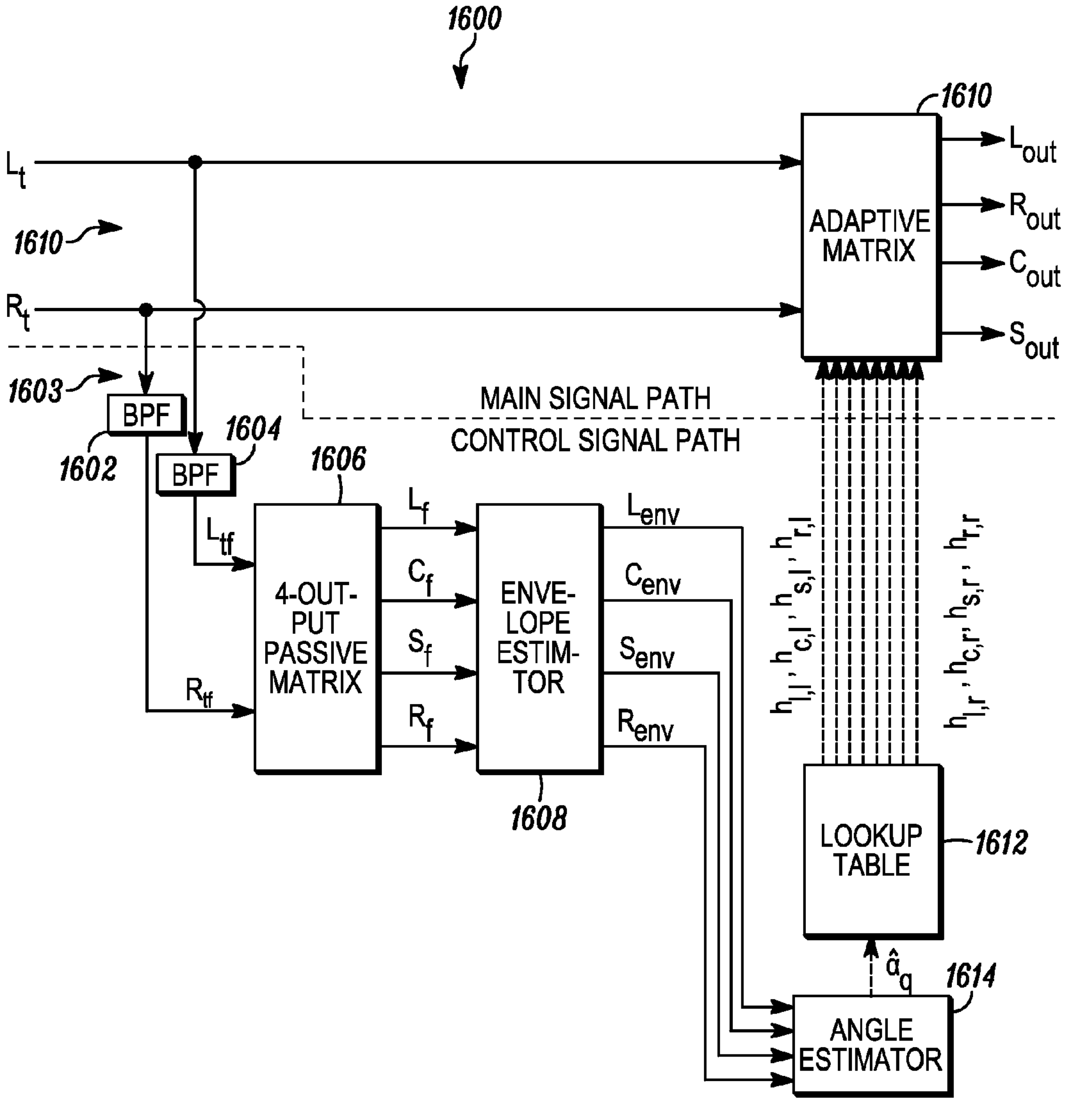
FIG. 16 is a functional system block diagram of an alternative embodiment with four outputs.
Figure 17:
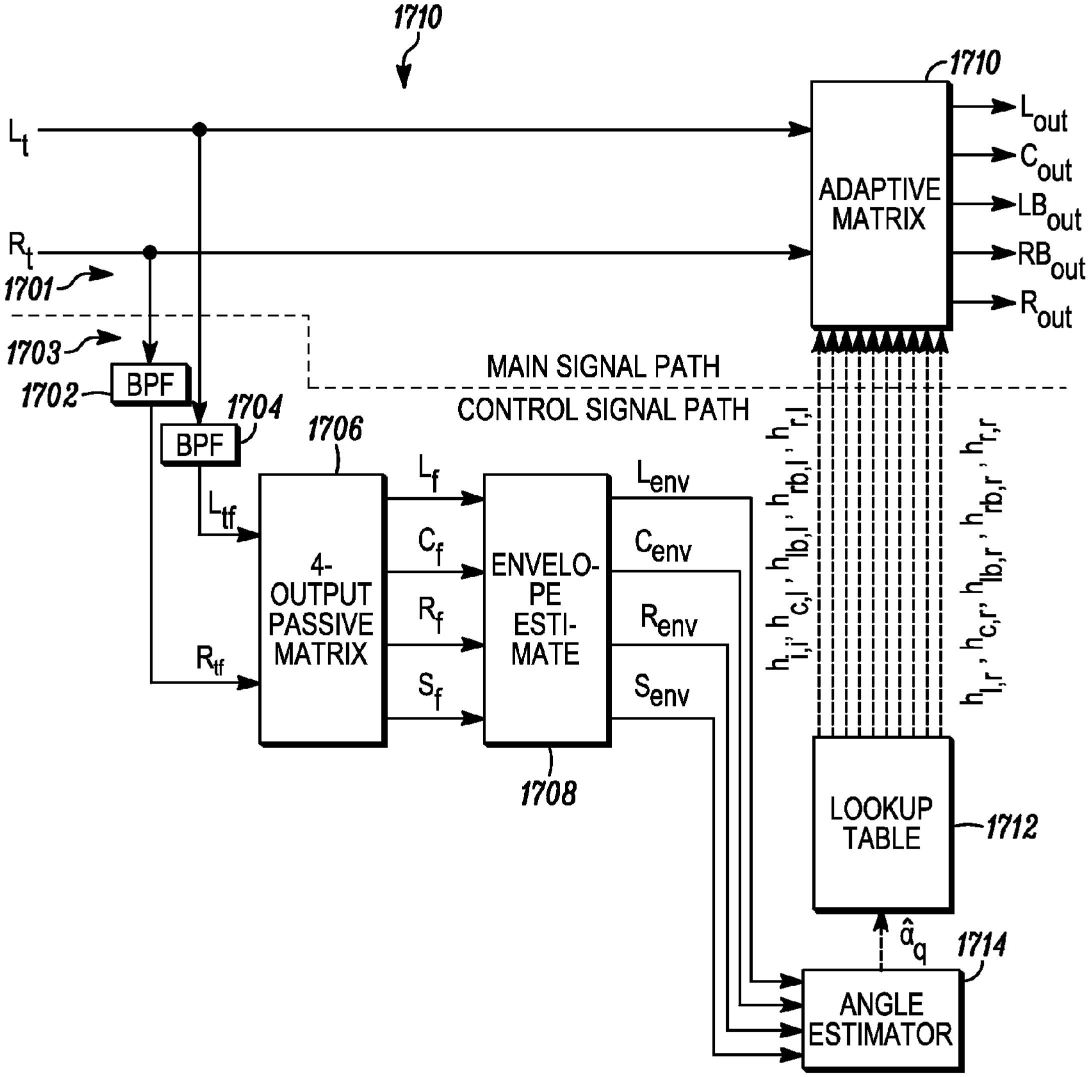
FIG. 17 is a functional system block diagram of an alternative embodiment with five outputs.

FIG. 16 and FIG. 17 illustrate respective alternative implementations of the four output and five output active matrix decoders. In these implementations, the main signal path (circuit 1601 in FIG. 16; circuit 1701 in FIG. 17) is composed of just the adaptive matrix block (modules 1610 and 1710 in FIGS. 16 and 17, respectively). The input signals $L_t$ and $R_t$ are fed directly into the adaptive matrix block to generate the outputs $L_{out}$, $C_{out}$, $S_{out}$, and $R_{out}$ for the four output case (circuit 1600 in FIG. 16) and the outputs $L_{out}$, $C_{out}$, $LB_{out}$, $RB_{out}$, and $R_{out}$ for the five output case (circuit 1700 in FIG. 17). Respective adaptive matrix decoders 1610, 1710 use equation (27) to compute the outputs using the H matrix of equation (28) for the four output case and the H matrix of equation (72) for the five output case. The appropriate adaptive matrix coefficients $h_{l,l}$, $h_{l,r}$, $h_{c,l}$, $h_{c,r}$, $h_{s,l}$, $h_{s,r}$, $h_{r,l}$, and $h_{r,r}$ for the four output case and $h_{l,l}$, $h_{l,r}$, $h_{c,l}$, $h_{c,r}$, $h_{lb,l}$, $h_{lb,r}$, $h_{rb,l}$, $h_{rb,r}$, $h_{r,l}$, and $h_{r,r}$ for the five output case are computed in the control signal path (circuit 1603 in FIG. 16; circuit 1703 in FIG. 17) and fed into the adaptive matrix decoder module.

In the control signal path (circuit 1602 in FIG. 16; circuit 1703 in FIG. 17), the input signals $L_t$ and $R_t$ are fed into the band-pass filter blocks to obtain the filtered signals $L_{tf}$ and $R_{tf}$, respectively. The filtered input signals $L_{tf}$ and $R_{tf}$ are fed into the 4-output passive matrix module (block 1606 in FIG. 16; block 1706 in FIG. 17) to generate the filtered versions of the intermediate signals $L_f$, $C_f$, $S_f$, and $R_f$ according to equations (1) through (4). The filtered intermediate signals are fed into the envelope estimator module (block 1608 in FIG. 16; block 1708 in FIG. 17) to generate the signal envelopes $L_{env}$, $C_{env}$, $S_{env}$, and $R_{env}$. The signal envelopes $L_{env}$, $C_{env}$, $S_{env}$, and $R_{env}$ are fed into the angle estimator module (block 1614 in FIG. 16; block 1714 in FIG. 17).

Figure 18:
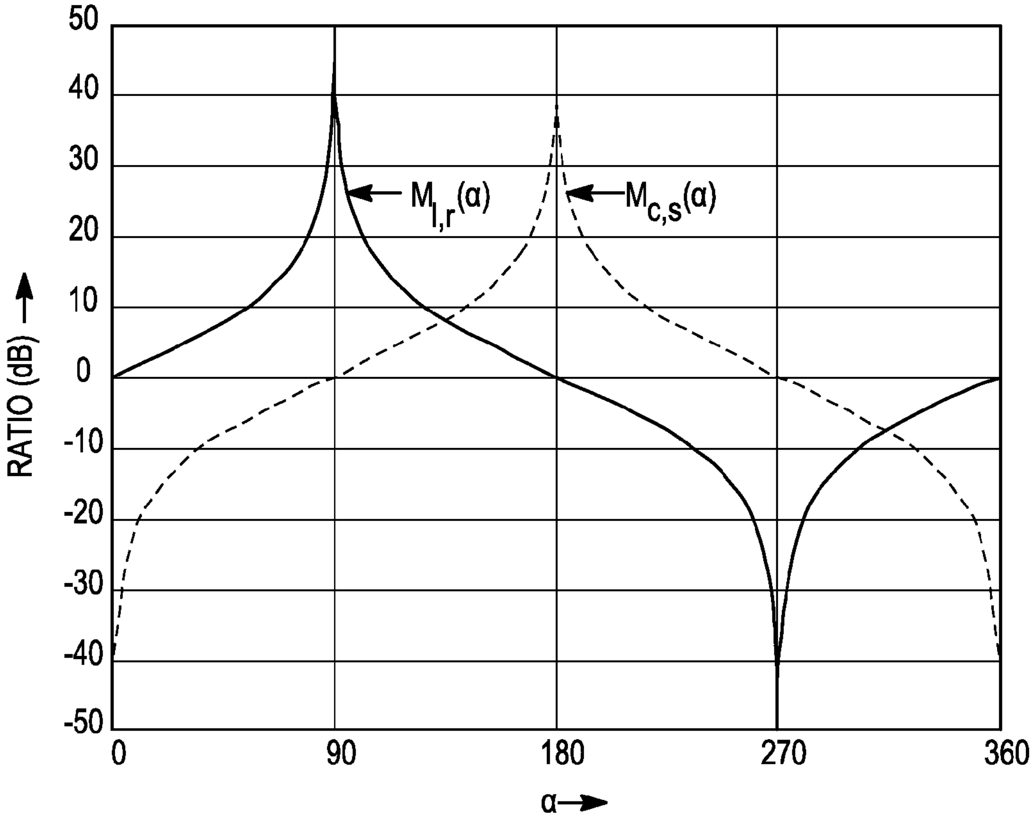
FIG. 18 is a graph showing the ratios $M_{l,r}(\alpha)$ and $M_{c,s}(\alpha)$ as a function of the panning angle α.

The angle estimator block uses equations (47) and (48) to compute the ratios $M_{l,r}$ and $M_{c,s}$ in dB. FIG. 18 shows the ratios $M_{l,r}(\alpha)$ and $M_{c,s}(\alpha)$ as a function of the panning angle $\alpha$. In the graphs of FIG. 18, the maximum ratios are limited to ±50 dB by appropriate choice of the constant $\delta$. It is seen from the graphs that for each value of $\alpha$, the pair of ratios ($M_{l,r}$, $M_{c,s}$) takes on a unique value. Therefore, using appropriate quantizers for the ratios $M_{l,r}$ and $M_{c,s}$, the angle can be estimated, e.g., accurate to within a degree. As noted earlier, the ratios $M_{l,r}$ and $M_{c,s}$ may not attain their ideal values in a practical system and in that event, the two ratios are assumed to be proportionately affected; in other words, the ratio of ratios is assumed to be constant for any given $\alpha$.

In an embodiment, the estimated angle $\hat{\alpha}_q$ may be smoothed by a first order filter using a filter time constant of about 10 milliseconds. The estimated angle is then used to look up the appropriate adaptive matrix coefficient values from a lookup table module (block 1612 in FIG. 16; bock 1712 in FIG. 17). The adaptive matrix coefficient values are then fed into the adaptive matrix module (block 1610 in FIG. 16; block 1710 in FIG. 17). The lookup table module stores the adaptive matrix coefficient values, namely, $h_{l,l}$, $h_{l,r}$, $h_{c,l}$, $h_{c,r}$, $h_{s,l}$, $h_{s,r}$, $h_{r,l}$, and $h_{r,r}$ for the four output case and $h_{l,l}$, $h_{l,r}$, $h_{c,l}$, $h_{c,r}$, $h_{lb,l}$, $h_{lb,r}$, $h_{rb,l}$, $h_{rb,r}$, $h_{r,l}$, and $h_{r,r}$ for the five output case, for each quantized angle value $\hat{\alpha}_q$, e.g., for each degree from 0 to 360. These values may be pre-computed using equations (43) through (46) and (28) for the four output case and equations (87) through (91) and (72) for the five output case. By default, the passive matrix coefficient values from equation (12) (for the four output case) and equation (59) (for the five output case) are used as the adaptive matrix coefficient values in the respective lookup table modules.

Other implementations of the present disclosure are possible. For example, the main signal paths of FIG. 14 and FIG. 15 can be combined with the control signal paths of FIG. 16 and FIG. 17 respectively. In this case, the lookup table block will hold variable gain values $g_l$, $g_c$, $g_s$, and $g_r$ for the four output case and $g_l$, $g_c$, $g_{lb}$, $g_{rb}$, and $g_r$ for the five output case instead of the adaptive matrix coefficient values. Similarly, the main signal paths of FIG. 16 and FIG. 17 can be combined with the control signal paths of FIG. 14 and FIG. 15 respectively. In this case, the variable gains computed by the linear equation solver block 14 will be transformed using equation (28) or (72) into the adaptive matrix coefficient values, namely, $h_{l,l}$, $h_{l,r}$, $h_{c,l}$, $h_{c,r}$, $h_{s,l}$, $h_{s,r}$, $h_{r,l}$, and $h_{r,r}$ for the four output case and $h_{l,l}$, $h_{l,r}$, $h_{c,l}$, $h_{c,r}$, $h_{lb,l}$, $h_{lb,r}$, $h_{rb,l}$, $h_{rb,r}$, $h_{r,l}$, and $h_{r,r}$ for the five output case before they are fed into the adaptive matrix block.

The implementations illustrated by the block diagrams in FIG. 14, FIG. 15, FIG. 16, and FIG. 17 are primarily digital in nature. Equivalent analog implementations are possible using appropriate circuitry. In the digital implementations, the variable gains or the adaptive matrix coefficient values are computed for every sample index n. Alternatively, the variable gains or the adaptive matrix coefficient values can be computed once every N (>1) samples and interpolated to obtain the values for each sample index.

Figure 19:
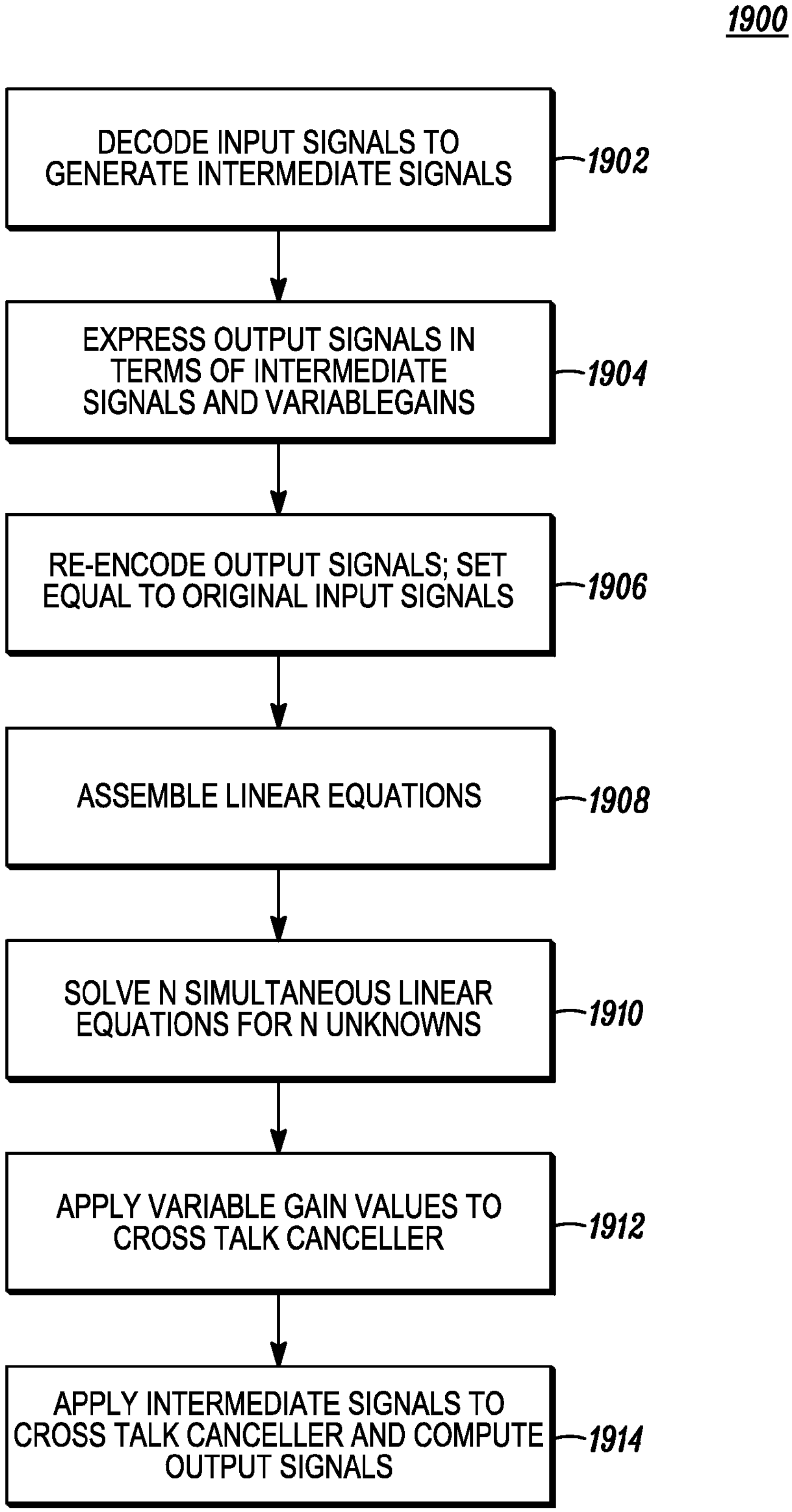
FIG. 19 is a flow chart illustrating a method of computing gain values in accordance with an embodiment.

FIG. 19 illustrates an exemplary method 1900 for decoding input signals $L_t$ and $R_t$ values in accordance with various embodiments of the present disclosure. Method 1900 involves decoding (task 1902) input signals $L_t$ and $R_t$ to generate intermediate signals L, C, S, and R (See FIGS. 2 and 14). The output signals may be expressed (task 1904) in terms of these intermediate signals and variable gains. The output signals are re-encoded and set equal to the original (pre-decoded) input signals (task 1906). In order to compute the variable gain values (e.g., $g_l$, $g_c$, $g_s$, and $g_r$), the relevant relationships among the variable gain values and other parameters, including necessary boundary conditions, are determined (task 1908). These other parameters may include the scaling coefficients associated with the various summers used in the passive matrix decoder and cross talk canceller, the input, intermediate, and output signal values (see, e.g., FIGS. 2, 5, 8, 14, and 15).

Method 1900 further involves solving (task 1910) a set of N expressions (equations) with N variables to obtain the variable gain values (e.g., $g_l$, $g_c$, $g_s$, and $g_r$). The variable gain values, along with the intermediate signals L, C, S, and R, are applied (task 1912) to the cross talk canceller, whereupon the output signals $L_{out}$, $C_{out}$, $S_{out}$, and $R_{uot}$ are generated (task 1914).

In the foregoing description, the use of relational terms such as first and second, top and bottom, and the like, if any, are used solely to distinguish one from another entity, item, or action without necessarily requiring or implying any actual such relationship or order between such entities, items or actions. Much of the inventive functionality and many of the inventive principles are best implemented with or in software programs or instructions. It is expected that one of ordinary skill, notwithstanding possibly significant effort and many design choices motivated by, for example, available time, current technology, and economic considerations, when guided by the concepts and principles disclosed herein will be readily capable of generating such software instructions and programs with minimal experimentation. Therefore, further discussion of such software, if any, will be limited in the interest of brevity and minimization of any risk of obscuring the principles and concepts described herein.

As understood by those in the art, various aspects of the present disclosure may be implemented in a controller which includes a processor that executes computer program code to implement the methods described herein. Embodiments include computer program code containing instructions embodied in tangible media, such as floppy diskettes, CD-ROMs, hard drives, or any other computer-readable storage medium, wherein, when the computer program code is loaded into and executed by a processor, the processor becomes an apparatus for implementing the methods and apparatus described herein.

Embodiments of the various techniques described herein may be implemented in digital electronic circuitry, or in computer hardware, firmware, software, or in combinations of them. Embodiments may be implemented as a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program, such as the computer program(s)

described above, can be written in any form of programming language, including compiled or interpreted languages, and can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network. Generally, a computer also may include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory may be supplemented by, or incorporated in special purpose logic circuitry.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

It will be appreciated that the above description for clarity has described various embodiments with reference to different functional units and processors. However, it will be apparent that any suitable distribution of functionality between different functional units or processors may be used. For example, functionality illustrated to be performed by separate processors or controllers may be performed by the same processor or controllers. Hence, references to specific functional units are only to be seen as references to suitable means for providing the described functionality rather than indicative of a strict logical or physical structure or organization.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the devices and methods described herein. Rather, the foregoing detailed description will provide those skilled in the art with a convenient road map for implementing exemplary embodiments. It being understood that various changes may be made in the function and arrangement of elements described in an exemplary embodiment without departing from the scope of the invention as set forth in the appended claims.

What is claimed:

1. An audio matrix decoder for decoding input signals $L_t$ and $R_t$ into output signals $L_{out}$, $C_{out}$, $S_{out}$, and $R_{out}$ for a panning angle α, the audio matrix decoder comprising:

a passive matrix decoder module having first and second summers each having a scaling coefficient a, said passive matrix decoder module being configured to decode said input signals $L_t$ and $R_t$ into intermediate signals L, C, S, and R; and a cross talk canceller module comprising:

a first gain element configured to apply a variable gain $g_l$ to said intermediate signal L;

a second gain element configured to apply a variable gain $g_c$ to said intermediate signal C;

a third gain element configured to apply a variable gain $g_s$ to said intermediate signal S;

a fourth gain element configured to apply a variable gain $g_r$ to said intermediate signal R;

a third summer, having a scaling coefficient p;

a fourth summer having a scaling coefficient a;

a fifth summer having said scaling coefficient a; and a sixth summer having a scaling coefficient p, where p=1/(2a);

wherein:

$$g_l = \frac{|C|}{a \cdot |L|},\ g_c = 0,\ g_s = \frac{|R|}{p \cdot |S|},\ \text{and } g_r = 0 \text{ for } 0 \le \alpha < 90.$$

2. The audio matrix decoder of claim 1, wherein:

$$g_l = \frac{|S|}{a \cdot |L|},\ g_c = \frac{|R|}{p \cdot |C|},\ g_s = 0,\ \text{and } g_r = 0 \text{ for } 90 \le \alpha < 180;$$

$$g_l = 0,\ g_c = \frac{|L|}{p \cdot |C|},\ g_s = 0,\ \text{and } g_r = \frac{|S|}{a \cdot |R|}$$

for 180 ≤ α < 270; and $$g_l = 0,\ g_c = 0,\ g_s = \frac{|L|}{p \cdot |S|},\ \text{and } g_r = \frac{|C|}{a \cdot |R|} \text{ for } 270 \le \alpha < 360.$$

3. The audio matrix decoder of claim 1, wherein an output of said passive matrix decoder module is applied as an input to said cross talk canceller module.

4. The audio matrix decoder of claim 1, wherein p=a=0.707.

5. The audio matrix decoder of claim 1, further comprising a look up table module configured to determine said variable gain values $g_l$, $g_c$, $g_s$, and $g_r$ as a function of said intermediate signals L, C, S, and R.

6. The audio matrix decoder of claim 1, wherein:

said first summer is configured to combine $aL_t$ with $aR_t$ to form said intermediate signal C; and said second summer is configured to combine $aL_t$ with $(-a)R_t$ to form said intermediate signal S.

7. The audio matrix decoder of claim 1, wherein said third, fourth, fifth, and sixth summers are each configured to combine at least one of said intermediate signals L, C, S, and R with at least one of a scaled value of $g_lL$, $g_cC$, $g_sS$, and $g_rR$.

8. The audio matrix decoder of claim 1, wherein said third summer is configured to combine L, $(-p)Sg_s$, and $(-p)Cg_c$ to form said output signal $L_{out}$.

9. The audio matrix decoder of claim 8, further wherein:

said fourth summer is configured to combine C, $(-a)Lg_l$, and $(-a)Rg_r$ to form said output signal $C_{out}$;

said fifth summer is configured to combine S, $(-a)Lg_l$, and $(a)Rg_r$ to form said output signal $S_{out}$; and said sixth summer is configured to combine R, $(-p)Cg_c$, and $(p)Sg_s$ to form said output signal $R_{out}$.

* * * * *